United States Patent [19]

Fujioka

[11] Patent Number: 5,559,996
[45] Date of Patent: Sep. 24, 1996

[54] LEVEL CONVERTER INCLUDING WAVE-SHAPING CIRCUIT AND EMULATOR MICROCOMPUTER INCORPORATING THE LEVEL CONVERTER

[75] Inventor: Shuzo Fujioka, Itami, Japan

[73] Assignee: Mitsubishi Denki Kabushiki Kaisha, Tokyo, Japan

[21] Appl. No.: 180,063

[22] Filed: Jan. 11, 1994

[30] Foreign Application Priority Data

Jan. 12, 1993 [JP] Japan .................................. 5-003267

[51] Int. Cl.⁶ ...................................................... G06F 3/00
[52] U.S. Cl. .............................. 395/500; 326/68; 326/33; 326/98; 326/63; 327/291; 327/134; 327/333
[58] Field of Search ..................................... 364/488, 578; 395/500; 365/189.09, 185, 189.07, 189.11, 226, 227, 177, 189.01, 230.01, 230.06, 104, 210; 326/110, 84, 56, 106, 81, 73, 68, 33, 98, 63; 327/88, 65, 100, 208, 306, 334, 427, 432, 530, 537, 291, 134, 333

[56] References Cited

U.S. PATENT DOCUMENTS

| | | | |
|---|---|---|---|
| 4,527,076 | 7/1985 | Matsuo et al. | 326/68 |
| 4,572,974 | 2/1986 | Frieling et al. | 326/68 |
| 4,740,718 | 4/1988 | Matsui | 326/68 |
| 4,837,462 | 6/1989 | Watanabe et al. | 326/33 |
| 4,894,560 | 1/1990 | Chung | 327/134 |
| 4,926,070 | 5/1990 | Tanaka et al. | 326/68 |
| 4,929,945 | 5/1990 | Kushiyama | 341/50 |
| 5,099,143 | 3/1992 | Arakawa | 365/189.09 |
| 5,113,097 | 5/1992 | Lee | 326/81 |
| 5,225,720 | 7/1993 | Kondoh et al. | 326/50 |

FOREIGN PATENT DOCUMENTS

| | | |
|---|---|---|
| 54-9040 | 4/1979 | Japan . |
| 57-59690 | 12/1982 | Japan . |
| 59-216329 | 12/1984 | Japan . |

*Primary Examiner*—Kevin J. Teska
*Assistant Examiner*—Jacques Louis-Jacques
*Attorney, Agent, or Firm*—Leydig, Voit & Mayer

[57] ABSTRACT

A level converter circuit has first and second P-channel transistors having the same first $\beta$ values, sources of the first and second P-channel transistors being commonly connected to a first potential V1, drains of the first and second P-channel transistors being connected to gates of the second and first P-channel transistors, respectively; first and second N-channel transistors having the same second $\beta$ values, the first and second N-channel transistors having drains respectively connected to the drains of the first and second P-channel transistors and sources which are grounded; a first inverter for inverting a level-conversion input signal and supplying the inverted signal to the gate of the second N-channel transistor, the first inverter being operated by a power supply of a second potential V2; a second inverter for inverting the output of the first inverter and supplying the further inverted signal to the gate of the first N-channel transistor, the second inverter being operated by a power supply of the second potential V2; and a wave-shaping device for wave-shaping a signal obtained at the junction of the drain of the first P-channel transistor and the drain of the first N-channel transistor. The second $\beta$ values of the first and second N-channel transistors are more than 50 times as large as the first $\beta$ values of the first and second P-channel transistors.

8 Claims, 22 Drawing Sheets

FIG. II

TO TARGET SYSTEM

LEVEL CONVERTER INCLUDING WAVE-SHAPING CIRCUIT AND EMULATOR MICROCOMPUTER INCORPORATING THE LEVEL CONVERTER

BACKGROUND OF THE INVENTION

1. Field of the Invention

The present invention relates to a program-developing emulator microcomputer and piggyback microcomputer which are used in, for example, development of microcomputer applications, as well as to a level converter circuit which is incorporated in such a microcomputer. The invention also is concerned with an LSI test system and an emulator system which use the above-mentioned microcomputers.

2. Description of the Related Art

There is a current trend towards reduction in the source voltages for various integrated circuit devices to cope with demands for reduction in electrical power consumption and adaptability to battery power supply. For instance, a microcomputer unit which can operate with a single battery (D.C. 1.5 V) has been brought to market. In general, a microcomputer incorporates programs. In order to develop such programs, it is necessary to develop also an emulator microcomputer or a piggyback microcomputer separately from the mass-produced microcomputers as the commercial goods.

EPROMs loaded on a piggyback microcomputer or an emulator for operating the emulator microcomputer usually require a source voltage of 5 V. It is therefore necessary to employ a level converter circuit for converting the source voltage when the EPROM is connected to a microcomputer which operates with a voltage lower than the source voltage for the EPROM.

A description will now be given of the level converter circuit. Problems encountered when the level converter circuit is not used will be described first, with specific reference to FIG. 19.

FIG. 19 is a circuit diagram of a complementary MOS integrated circuit. N-channel MOSFETs 122 and 124 have sources connected to a negative electrode which is kept at 0 (zero) potential. A P-channel MOSFET 121 has a source connected to a first positive electrode which is held at a potential E1, while a P-channel MOSFET 123 has a source connected to a second positive electrode which is held at a potential E2. A relationship E1<E2 exists for these potentials E1 and E2.

An input signal 125 is inverted into an inverted input signal 126 through an inverter circuit which is constituted by the MOSFETs 121 and 122. The inverted input signal 126 is supplied to the gate of an inverter circuit which is constituted by the MOSFETs 123 and 124. In the described circuitry, a potential between 0 and E2 appears at the output terminal 127. In order that the potential 0 is obtained at the output terminal 27, it is necessary to turn off the MOSFET 123 while turning on the MOSFET 124. Therefore, in order to achieve stable operation, it is preferred that the level of the inverted input signal 126 be high. Actually, however, the level of this signal is limited to the range only between 0 and E1. The MOSFET 123 cannot be turned off even when the inverted input signal 126 is set to the highest level, i.e., E1, if the MOSFET 123 has such a threshold level $V_{TH}$ that meets the condition of $E2-E1>V_{TH}$. This not only makes it impossible to set the level of the output terminal 127 to 0 but undesirably allows a current to flow from the second positive electrode of the potential E2 to the negative electrode of the 0 potential through the MOSFETs 123 and 124. Consequently, the expected operation is not always ensured, and low current consumption, which is one of the advantages of complementary MOS integrated circuit, is greatly impaired.

The level converter circuit is used to eliminate the problem described above. FIG. 20 illustrates the most basic complementary level conversion circuit which uses P-channel MOSFETs and N-channel MOSFETs.

Referring to FIG. 20, sources of N-channel MOSFETs 21, 23 and 25 are connected to the negative voltage of 0 potential. The source of a P-channel MOSFET 20 is connected to a first positive electrode of a potential E1. Sources of P-channel MOSFETs 22 and 24 are connected to a second positive electrode of potential E2. A signal is input through a terminal 207 so that an inverted signal 202 is obtained. The levels of the signals 201 and 202 vary between 0 and E1. The level converter circuit produces an output signal 203. A signal 204 is obtained through inversion of the signal 203.

The level of the signals 203 and 204 vary between 0 and E2. When the signal 201 is 0 potential (low level), the signal 202 takes the potential E1, while the signal 203 takes the 0 potential and the signal 204 is set to the potential E2, whereby the MOSFETs 20, 22 and 25 are turned on, while the MOSFETs 21, 23 and 24 are turned off. Conversely, when the signal 201 is set to the potential E1 (high level), MOSFET 23 is turned on to change the level of the signal 204 towards 0. At the same time, the level of the signal 202 is set to 0, thus turning off the MOSFET 25.

Consequently, MOSFETs 25 and 23 are turned off and on, respectively, so that the MOSFET 22 is urged towards off state, while MOSFET 24 is urged towards on state. Consequently, the levels of the signals 203 and 204 respectively tend toward E2 and 0, thus accelerating the switching tendencies of MOSFET 22 and MOSFET 24 towards off and on states, respectively. Finally, a balance or equilibrium state is obtained in which the signals 201, 202, 203 and 204 are respectively set to potentials E1, 0, E2 and 0, with MOSFETs 20, 22 and 25 turned off and MOSFETs 21, 23 and 24 turned on, respectively.

When the signal 201 is set again to potential 0, MOSFET 23 is turned off so that the signal 202 is turned to the potential E1, thus turning MOSFET 25 on. Consequently, the level of the signal 203 tends to vary towards 0. Since MOSFET 23 is off while MOSFET 25 is on, MOSFET 22 is urged towards on while MOSFET 24 is urged towards off, causing the signals 203 and 204 to vary towards the potential 0 and the potential E2, respectively. Consequently, MOSFETs 24 and 24 are respectively accelerated towards on and off states, respectively, finally establishing an equilibrium state in which the levels of the signals 201, 202, 203 and 204 are respectively set to 0, E1, 0 and E2, with MOSFETs 20, 22 and 25 and MOSFETs 21, 23 and 24 turned to on and off states, respectively.

The above-described circuit operation can be performed smoothly by virtue of the fact that the gate control for N-channel MOSFETs 21, 23 and 25 having source potential of 0 is conducted within the range of potential between 0 and E1, that the gate control of P-channel MOSFET 20 having the source potential E1 is conducted within the range of potential between 0 and E1 and that the gate control for P-channel MOSFETs 22 and 24 having the source potential E2 is conducted within the range of potential between 0 and E2. In particular, the safer operation of the circuit shown in FIG. 20 than that of the circuit shown in FIG. 19 due to the fact that the gate voltages of MOSFETs 22 and 24 are controlled within the range of potential between 0 and E2, i.e., the fact that each of these MOSFETs is supplied with a gate voltage which is high enough to turn each MOSFET on or off.

A description will now be given of a conventional emulator microcomputer and an emulator system. FIG. 21 shows the circuit of emulator system which does not use any level converter circuit.

Referring to FIG. 21, numeral 141 denotes an emulator microcomputer, 142 denotes an emulator which controls the emulator microcomputer 141, and 143 denotes a target system for realizing a desired function by applying a microcomputer. The target system 143 is so constructed that terminals of the emulator microcomputer 141 are connectable thereto. After completion of debugging by the emulator system, a piggyback microcomputer or a mass-produced microcomputer as commercial goods can be connected to the target system 143 in place of the emulator microcomputer 141. A connection interface 144 is provided in the emulator 142 to enable connection of the emulator microcomputer 141. Numeral 1401 denotes a power supply of, for example, 5 volts. A signal line 1402, which is necessary for the emulator 142 to operate the emulator microcomputer 141, includes various lines such as an address signal line, a data signal line and a control BUS. Numeral 1403 denotes a signal line through which the target system 143 and the emulator microcomputer 141 are connected to each other.

The operation of the described system is as follows. A program for the operation of the emulator microcomputer 141 is incorporated in the emulator 142. The delivery of this program, as well as receipt of data from the microcomputer 141, is conducted via the signal line 1402. As the microcomputer 141 is operated, the target system 143 is activated in accordance with signals delivered through the terminals of the microcomputer 141. Signals such as those delivered through the terminals of the microcomputer 141, power supply clocks required for the operation of the microcomputer 141, reset signals, and so forth are supplied from the target system 143 to the microcomputer 141 via a signal line 1403. The emulator 142 is provided with debugging function and is capable of easily altering programs and conforming operations. The program to be installed on the mass-produced microcomputer is fabricated after debugging performed by the emulator 142. FIG. 22 illustrates an image of the described emulate system using the emulator microcomputer. An emulator microcomputer 153 is connected to the main part 151 of the emulator through a pod circuit 152. The emulator microcomputer 153 is connected to the target system 154 through, for example, an IC socket provided on the target system 154.

The use of the piggyback microcomputer is as follows. The program after debugging is written in EPROM. Using this EPROM, a final check of operation of the target system 143 is conducted by the piggyback microcomputer. FIG. 23 illustrates an image of the piggyback microcomputer. EPROM 162 storing the program written therein is connected to a piggyback microcomputer 161 and, in this state, the piggyback microcomputer 161 is connected to the target system.

FIG. 24 is a diagrammatic illustration of an emulator system which is used when the emulator 142 operates with a source voltage of 5 volts while the emulator microcomputer 141 and the target system 143 operate with a source voltage of 3 volts. A level converter circuit 145 is incorporated in the emulator 142. The level converter circuit 145 is formed of ICs which are presently available easily. The power supply of 3 volts is designated at a numeral 1404.

The emulator 142 operates with a source voltage of 5 volts. Therefore, the level converter circuit 145 added to the connector interface 144 converts the level of the signal line 141 to 3 volts to enable exchange of signals between the emulator 142 and the emulator microcomputer 141. Since emulator microcomputer 141 operates with a source voltage of 3 volts, the signal level of the signal line 1403 also is set to 3 volts, so that the target system 143 also operates with the source voltage of 3 volts. Even if the target system 143 designed for operation with a source voltage of 3 volts is operable with a voltage of 5 volts, any analog circuit or circuits which may exist in the target system preferably operate with the design source voltage of 3 volts, because such analog circuit or circuits have a large voltage-dependency. It is also necessary that the operation voltage be held at 3 volts during debugging, in order that evaluation and debugging are conducted by the emulation system under conditions which approximate, as much as possible, the actual conditions.

The level converter circuit of the type shown in FIG. 20 is incorporated in a part of an ordinary IC. It is impossible to obtain a level converter circuit alone. Practically, therefore, the level converter circuit 145 is constructed with circuits as shown in FIGS. 25 and 26. In these Figures, numeral 191 designates an open-collector inverter such as LSO 5, 192 denotes an inverter such as a circuit LSO 4, 1901 designates a power supply of 5 volts, 1902 denotes a power supply of 3 volts, 1903 and 1905 denote signal lines carrying signals of a level of 5 volts, 1904 and 1906 denote signal lines carrying signals of a level of 3 volts, and 193 and 194 denote pull-up resistors. The operation of the level converter circuit is illustrated in a timing chart in FIG. 27. The inverter circuit LSO 5 shown in FIG. 25 cannot produce a high level so that the level is pulled down to 3 volts by means of the pull-up resistor 193. On the other hand, the inverter circuit LSO 4 shown in FIG. 26 is capable of receiving signals of 3 volts even when the power supply voltage is 5 volts, because the voltages $V_{1H}$ and $V_{1L}$ are respectively 2 volts and 0.8 volts. However, since the output voltage $V_{OH}$ is 2.7 volts, the pull-up resistor 194 is used to pull up the output level to 5 volts. Thus, the circuit shown in FIG. 25 is capable of converting the input voltage of 5 volt to a voltage ranging between 2 and 7 volts, whereas the circuit shown in FIG. 26 is capable of converting an input voltage of 2 to 7 volts into an output voltage of 5 volts.

It is to be understood, however, that neither the circuit shown in FIG. 25 nor the circuit shown in FIG. 26 is able to produce a conversion output of 2 volts or lower. Furthermore, with these circuits, it is not easy to effect the level conversion particularly when the signal frequency is high, due to problems such as a rise of the output low level above 0 volts or distortion of waveform during conversion from low to high levels due to the use of the pull-up resistors 193 and 194. In addition, large electric currents are consumed in these circuits.

The level converter circuit of the type shown in FIG. 20 can safely operate despite any slight reduction of the potential E1 of the first positive electrode, but is not prepared for any reduction in the potential E2 of the second positive electrode. Thus, the level converter circuit of this type may fail to operate correctly when the potential E2 of the second positive electrode has been lowered. Namely, in such a case, it is difficult to convert an input voltage of 5 volts into an output voltage of 1 volt as shown in FIG. 28. In order to ensure safe functioning of the level converter circuit despite any reduction of the potential E2 of the second positive electrode, it is necessary that the P-channel MOSFETs 22 and 24 be designed to have sufficiently large β values.

It will not be so often required to vary the source voltage of the target system to a value ranging between 2 volts and 11 volts by the operation of the emulator system. Such a control, however, is needed when the emulator microcomputer is used for the purpose of testing mass-produced microcomputers.

FIG. 29 illustrates the construction of an LSI test system which uses an emulator microcomputer. The LSI test system includes the following parts or components: an LSI tester 161 for controlling the whole system; a device under test (DUT) 162 such as a microcomputer to be tested; an interface board 163 for interconnecting the LSI tester 161 and the DUT 162; a microcomputer 164 which is an emulator microcomputer or a piggyback microcomputer; a level converter circuit 165 similar to the level converter circuit 145 shown in FIG. 24; serial I/O ports 166, 169 used for serial communication; a memory 167 storing a program for operating the emulator microcomputer 164; an interface 168 for signal exchange between the emulator microcomputer 164 and the LSI tester 161; a 5-volt power supply 1601 derived from the LSI tester 161; a power supply 1602 supplied from the LSI tester 161 and used in testing the DUT 162; a signal line 1603 for exchange of signals between the LSI tester 161 and the interface board 163; a signal line 1604 for signal exchange between the DUT 162 and the level conversion circuit 165; a BUS 1605 which interconnects the emulator microcomputer 164 to the memory 167 and the interface 168; and a signal line 1606 for interconnecting the emulator microcomputer 164 and the level converter circuit 165.

The DUT 162, if it is an ordinary microcomputer, is constructed such that its address BUS and data BUS are externally connectable through terminals. It is therefore possible to test the DUT 162 by directly connecting it to the LSI tester 161. In the case of a microcomputer of the type which has only one serial I/O terminal, as is the case of an IC card microcomputer, it is necessary that all the tests be executed through this serial I/O. According to a testing method which is currently used for testing IC card microcomputers, a test program is introduced into the memory of the PUT through the serial I/O so that the PUT itself executes the test program and delivers the results of the test through the serial I/O. When this method is carried out through direct connection between the LSI tester and the DUT, an enormous number of test programs have to be delivered to the microcomputer as the DUT, which excessively burdens the LSI tester.

As a measure for solving this problem, it has been practiced to load an emulator microcomputer 164 on an interface board 163 such that the emulator microcomputer executes the serial data exchange with the DUT 162, thus unburdening the LSI tester 161. The memory 167 stores a program which is necessary for operating the serial I/O 166 and the interface 168 of the emulator microcomputer 164.

In general, testing of a microcomputer as the DUT 162 has to be done at various levels of the power supply voltage. Thus, the level of the signals on the signal line is varied, so that conversion of the level has to be done between the signal line 1604 and the signal line 1606. The level converter circuit 165 is provided to meet such a demand.

In this level converter circuit 165, however, the signal level is variable only over a limited range because this level converter circuit 165 has a construction similar to the circuit 145 shown in FIG. 24.

Conventional piggyback microcomputers are not adaptable to target systems operable with 3-volt power, because such microcomputers have EPROMs designed to operate with the power of 5 volts. Although EPROMs operable with a power supply at 3 volts have been commercially produced in recent years, piggyback microcomputers using such EPROM cannot be satisfactorily used when the target system operates with a source voltage of 3 volts or lower.

As will be understood from the foregoing description, the conventional emulator microcomputer and piggyback microcomputer require external provision of a level converter circuit when the operation voltage of the target system is different from that of the emulator. It has therefore been necessary to modify the emulator or the pod circuit in accordance with the type of the microcomputer of the target system or the source voltage of the target system. In addition, a conventional level converter circuit could not satisfactorily be used for an emulator system of the kind described, because it cannot perform level conversion to a low level, e.g., 2 volts or lower.

SUMMARY OF THE INVENTION

Accordingly, an object of the present invention is to provide a level converter circuit which converts an input level of 5 volts to a voltage ranging between 1 volt and 7 volts and vice versa.

It is also an object of the present invention to provide an emulator microcomputer or a piggyback microcomputer which incorporates a level converter circuit of the type mentioned above so as to be adaptable to target systems having source voltages different from the source voltage of the emulator microcomputer or the piggyback microcomputer.

It is also an object of the present invention to provide an emulator system and an LSI test system having n emulator microcomputer of the type mentioned above.

To these ends, according to one aspect of the present invention, there is provided a level converter circuit comprising: first and second P-channel transistors having the same $\beta$ value, the sources of the first and second P-channel transistors being commonly connected to a first potential V1, the drains of the first and second P-channel transistors being connected to the gates of the second and first P-channel transistors, respectively; first and second N-channel transistors having the same $\beta$ value, the first and second N-channel transistors having drains respectively connected to the drains of the first and second P-channel transistors and sources which are grounded; a first inverter for inverting the level-conversion input signal and supplying the inverted signal to the gate of the second N-channel transistor, the first inverter being operated by a power supply of a second potential V2; a second inverter for further inverting the output of the first inverter and supplying the further inverted signal to the gate of the first N-channel transistor, the second inverter being operated by a power supply of the second potential V2; and wave shaping means for wave-shaping a signal produced at the junction between the drain of the first P-channel transistor and the drain of the first N-channel transistor, wherein the $\beta$ value of the first and second N-channel transistors is set to a level which is more than 50 times as large that of the first and second P-channel transistors.

The above and other objects, features and advantages of the present invention will become clear from the following description of the preferred embodiments when the same is read in conjunction with the accompanying drawings,

DESCRIPTION OF THE PREFERRED EMBODIMENTS

First Embodiment

Figure 1A:
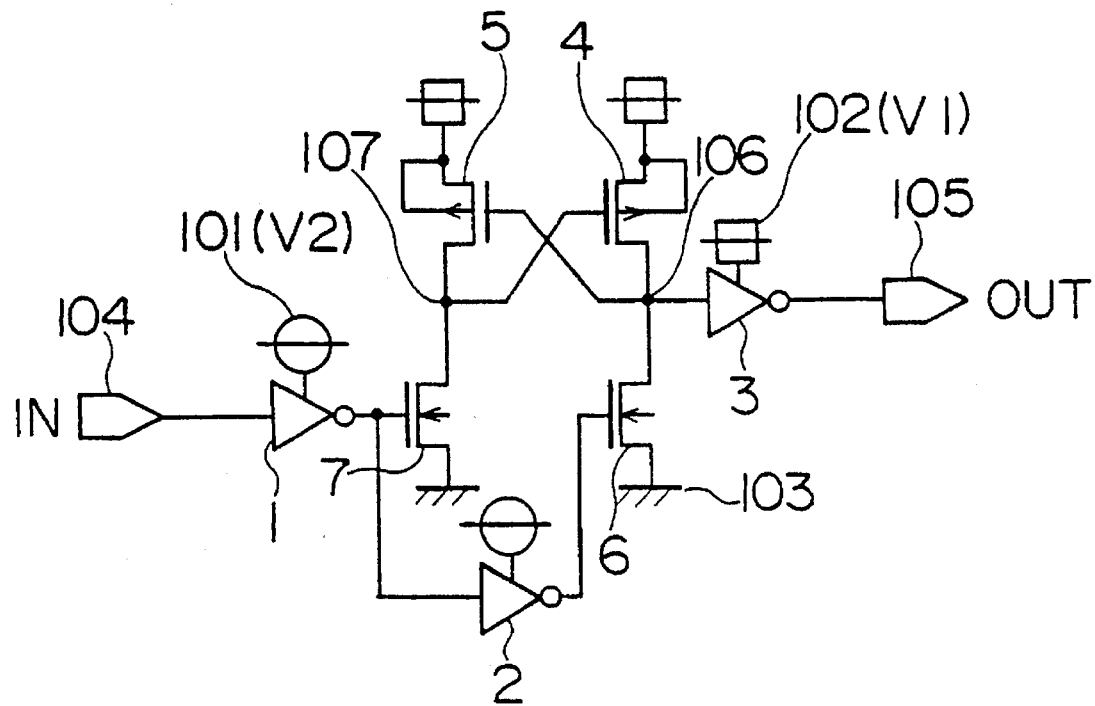
FIG. 1A is a circuit diagram showing the construction of a level converter circuit as a first embodiment of the present invention.

FIG. 1A is a circuit diagram showing a level converter circuit as a first embodiment of the present invention. Referring to this Figure, the level converter circuit includes an inverter for inverting the input signal 104, an inverter 2 for further inverting the output of the inverter 1, an inverter 3 for inverting a signal 106 to produce an output signal 105, P-channel transistors 4 and 5, and N-channel transistors 6 and 7. Numeral 101 denotes a voltage V2 before the level conversion, 102 denotes a voltage V1 after the level conversion, 103 denotes ground level, 106 denotes a signal carried by a signal line to which drains of the P-channel transistor 4 and the N-channel transistor 6 are connected, and 107 denotes a signal carried by a signal line to which are connected the drains of the P-channel transistor 5 and the N-channel transistor 7.

The P-channel transistors 4 and 5 have an identical $\beta$ value. Similarly, the N-channel transistors 6 and 7 have the same $\beta$ value. The $\beta$ value of the N-channel transistors 6 and 7 is not less than 50 times as large that of the P-channel transistors 4 and 5.

In general, the $\beta$ value of a transistor can be freely set by varying the dimensions of the transistor. The $\beta$ value is an important parameter which determines the driving ability, i.e., the output current, of the transistor. More specifically, the greater the $\beta$ value, the greater the output current. Inverters 1 and 2 have to have driving ability large enough to drive the N-channel transistors 6 and 7 even when the voltage V2 is lowered.

In this embodiment, the $\beta$ value of the N- and P-channel transistors in the inverters 1 and 2 is 380 $\mu A/V^2$, while the $\beta$ value of the N-channel transistors 6 and 7 is 1580 $\mu A/V^2$. At the same time, the $\beta$ value of the P-channel transistors 4 and 5 is 31 $\mu A/V^2$ and the $\beta$ value of the P- and N-channel transistors in the inverter 3 are 220 $\mu A/V^2$.

Figure 1B:
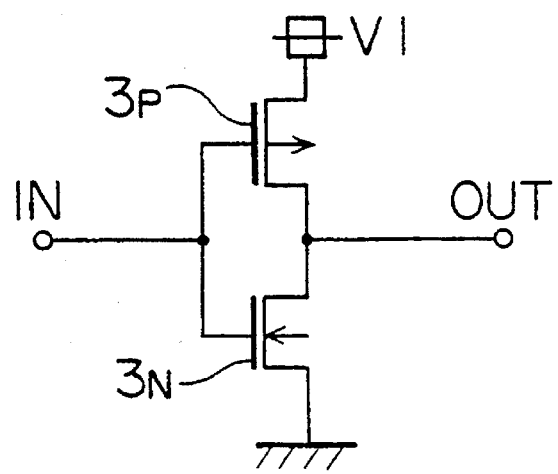
FIG. 1B is a circuit diagram showing the construction of an inverter incorporated in the first embodiment.

The inverter 3 may include a P-channel transistor 3P and an N-channel transistor 3N which are connected in series between the potential V1 and the ground level as shown in FIG. 1B.

Figure 2:
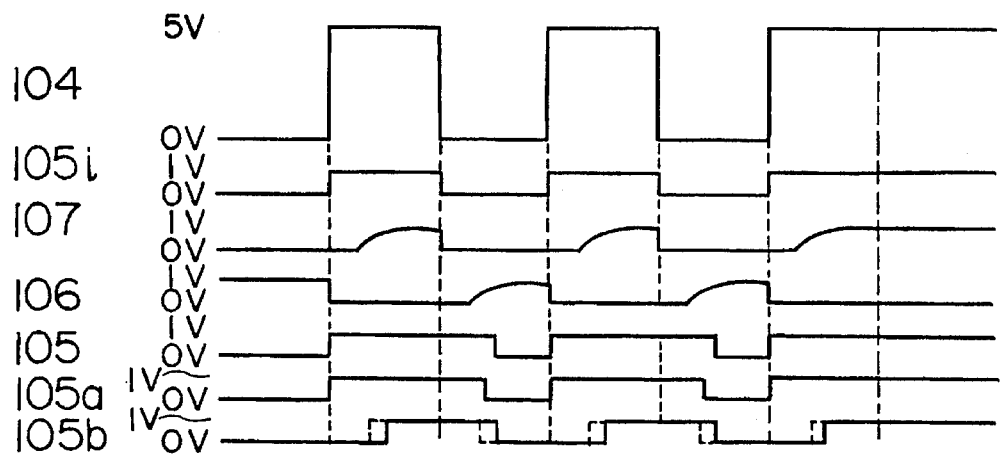
FIG. 2 is a timing chart illustrative of the operation of the first embodiment.

FIG. 2 is a timing chart illustrative of the operation performed when the voltages V2 and V1 are respectively 5 volts and 1 volt, in response to input of the input signal 104 of 5 volts at a frequency of 5 MHz. Thus, the level converter circuit is designed to convert an input voltage of 5 volts to an output voltage of 1 volt. This circuit does not operate unless the driving ability of the P-channel transistors 4 and 5 is smaller than that of the N-channel transistors 6 and 7. When the driving ability of the P-channel transistors 4 and 5 is small, the rise of the signals 107 and 106 is delayed as shown in FIG. 2. Therefore, the output signal 105 of the inverter 3, which operates in response to the signal 106, exhibits a distorted waveform with a duty ratio (ratio between duration of high-level to period of pulse) varying from that of an ideal waveform 105i.

The $\beta$ values of the P-channel transistors 4 and 5 are 31 $\mu A/V^2$. Conversion to 1 volt will be difficult when the $\beta$ value is below the above-mentioned value, because the driving ability of the P-channel transistors 4 and 5 is reduced to a level which is too low to drive the inverter 3 when the voltage V1 is lowered. Whether the input voltage of 5 volts can be converted into an output voltage of 1 volt depends on the driving ability of the P-channel transistors.

Figure 3:
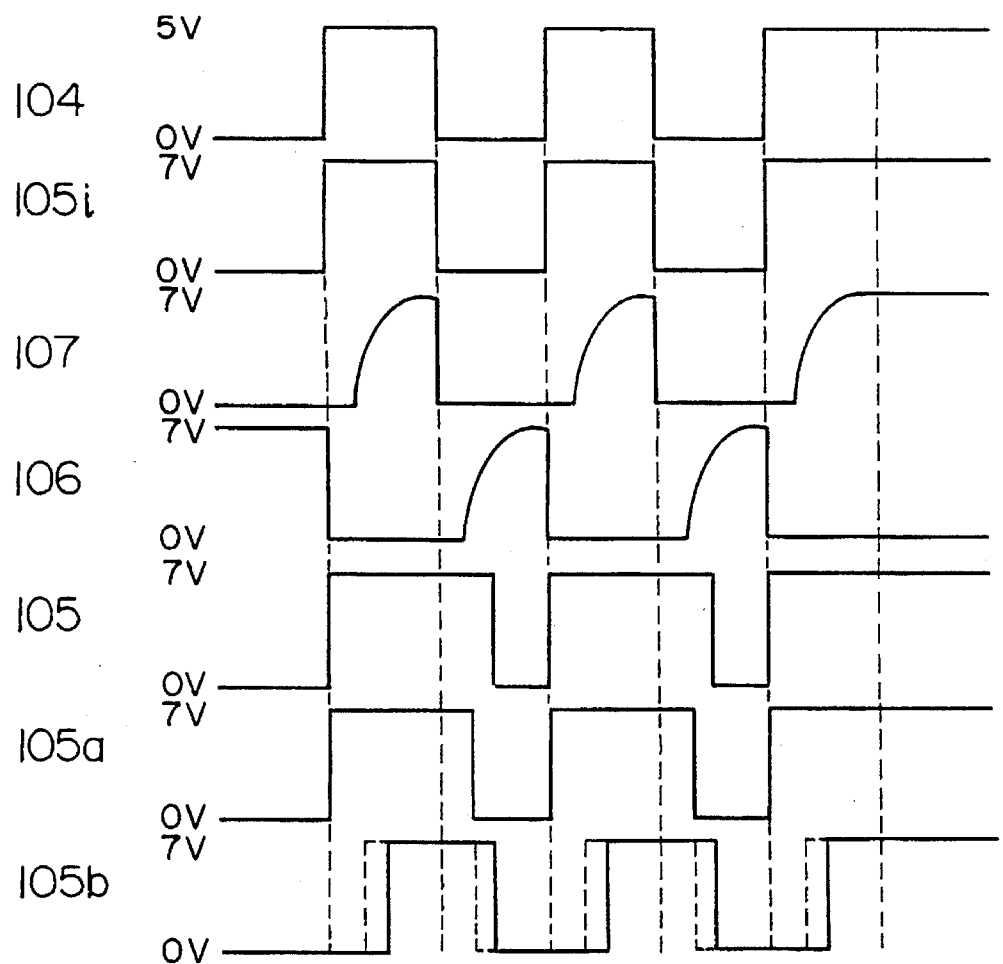
FIG. 3 is a timing chart illustrative of the operation of the first embodiment.

FIG. 3 is a timing chart illustrative of the operation performed when the voltages V2 and V1 are respectively 5 volts and 7 volts, in response to input of the input signal 104 of 5 volts at a frequency of 50 MHz. Thus, the level converter circuit is designed to convert an input voltage of 5 volts to an output voltage of 7 volts. In this case also, the β values of the P-channel transistors 4 and 5 are smaller than those of the N-channel transistors 6 and 7, so that the rise of the signals 107 and 106 is delayed, with the result that the waveform of the output signal 105 of the inverter 3 is distorted from that of the ideal signal waveform 105*i* and presents a different duty ratio.

Figure 4:
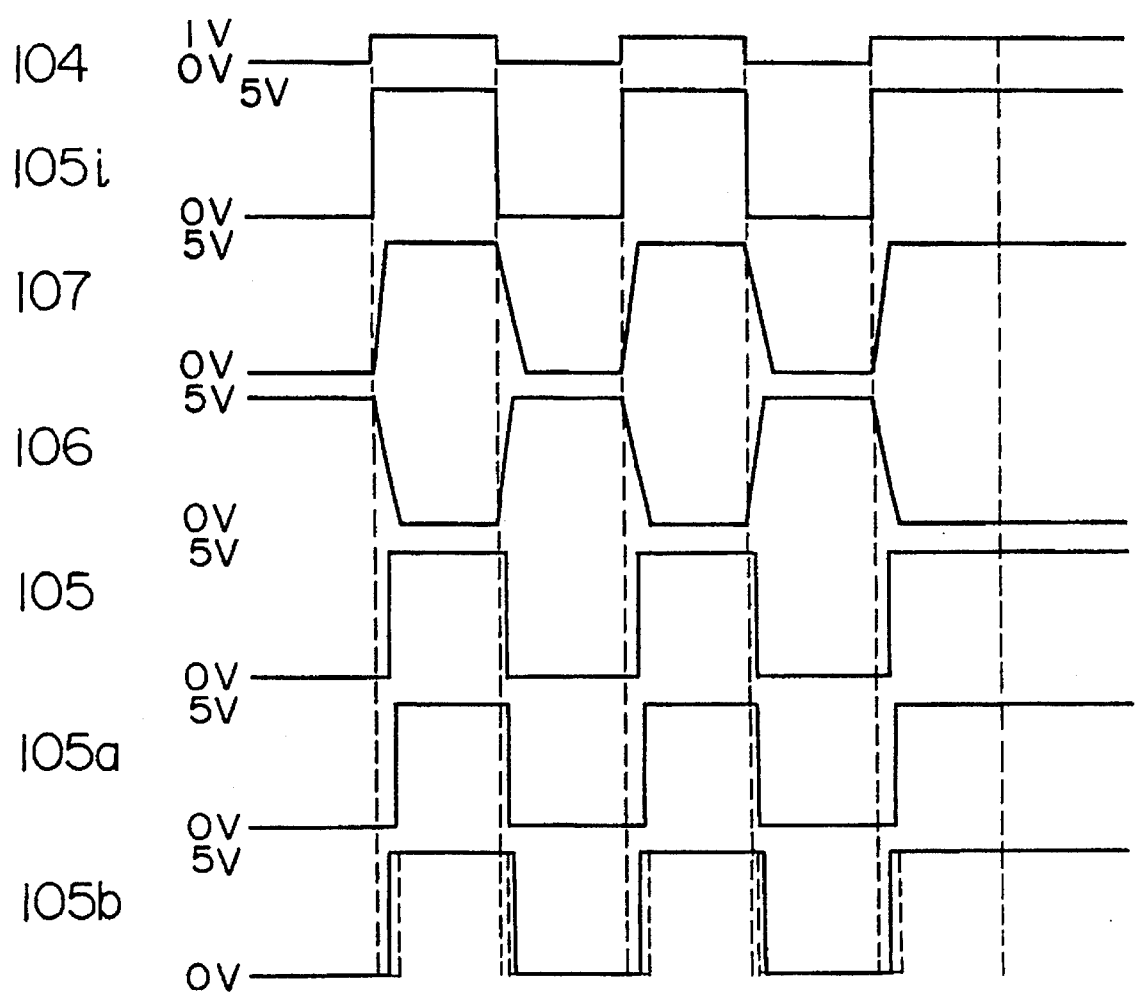
FIG. 4 is a timing chart illustrative of the operation of the first embodiment.

FIG. 4 is a timing chart illustrative of the operation performed when the voltages V2 and V1 are respectively set to 1 volt and 5 volts, in response to input of the input signal 104 of 1 volt at a frequency of 5 MHz. Thus, the level converter circuit is designed to convert an input voltage of 1 volt to an output voltage of 5 volts. In this case, the delay appears in the fall of the levels of the signals 107 and 106 rather than in the rise of these levels. This is because the driving ability of the N-channel transistors is reduced due to the fact that the voltage of the signal for driving the N-channel transistor 6 and 7 does not rise beyond 1 volt. Despite the reduction in the driving ability, however, there is no substantial distortion of the waveform, because the β value of the N-channel transistor is as large as 1580 μA/V². Consequently, the output signal 105 stably exhibits a waveform which approximates the ideal waveform 105*i*.

Figure 5:
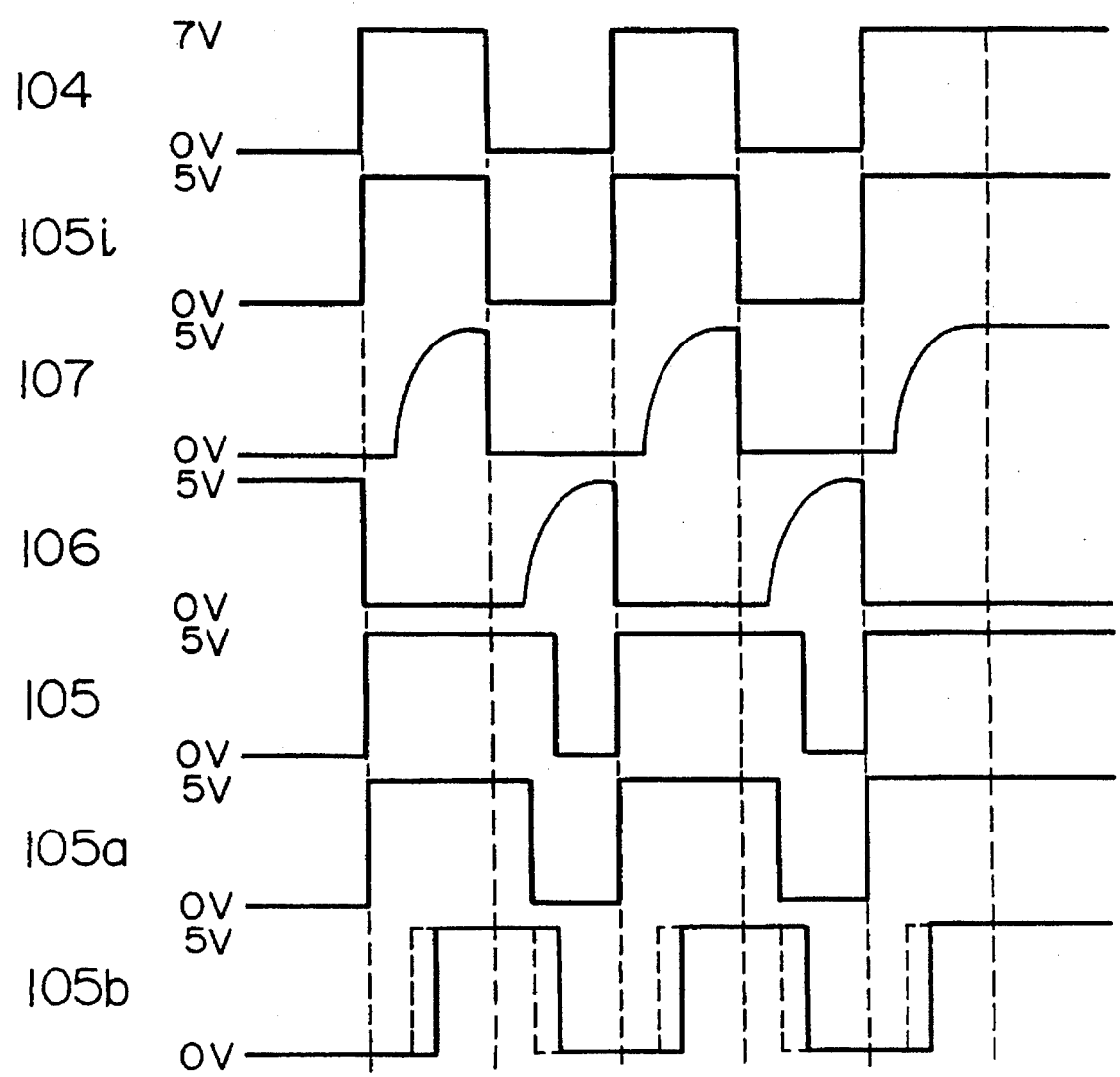
FIG. 5 is a timing chart illustrative of the operation of the first embodiment.

FIG. 5 is a timing chart illustrative of the operation performed when the voltages V2 and V1 are respectively set to 7 volts and 5 volts, in response to input of the input signal 104 of 7 volts at a frequency of 50 MHz. Thus, the level converter circuit is designed to convert an input voltage of 7 volts to an output voltage of 5 volts. In this case, in contrast to that shown in FIG. 4, the voltage of the input signal rises to 7 volts so that the driving ability of the N-channel transistors 6 and 7 is not lowered, thus causing a delay in the rise of the waveforms of the signals 107 and 106. Consequently, the waveform of the output signal 105 of the inverter 3 is distorted from that of the ideal waveform 105*i* to present a different duty ratio.

Thus, in the first embodiment as described, it is possible to perform a level conversion from a 5 V–5 MHz signal 1 V signal, from a 5 V–50 MHz signal to a 7 V signal, from a 1 V–50 MHz signal to a 5 V signal and from a 7 V–50 MHz signal to 5 V signal, although there are some deviations of the duty ratio. In this embodiment, the 1 V–5 MHz signal or 7 V–50 MHz signal is adopted to enable the level conversion circuit to operate beyond the range of operation of the emulator microcomputer.

Second Embodiment

It is assumed here that the threshold voltage VTH of the inverter 3 is set to a low level in the circuit used in the first embodiment. With such a low threshold voltage, the output signal of the inverter 3 exhibits a waveform designated at 105*a* in each of the timing charts shown in FIGS. 2 to 5. In the first embodiment, the β value of the inverter 3 is 220 μA/V² both for the P- and N-channel transistors. It is to be understood that the threshold voltage $V_{TH}$ can be lowered by setting the β value of the N-channel transistors to a level greater than that of the P-channel transistors. The threshold voltage $V_{TH}$, is V½ when the β value of the N-channel transistors is equal to the β value of the P-channel transistors. According to the design of the inverter 3 used in the second embodiment, the values of the N-channel transistors and the P-channel transistors are respectively set to 220 82 A/V² and 31 BA/V², so that the threshold voltage $V_{TH}$ is lowered approximately to V⅓. As a result, the deviation of the duty ratio of the output signal is reduced as represented by the signal waveform 105*a* shown in each timing chart. The waveform 105*a* shown in FIG. 4 inherently has a small distortion of the waveform and, therefore, is substantially the same as the output waveform of the first embodiment.

Third Embodiment

Figure 6:
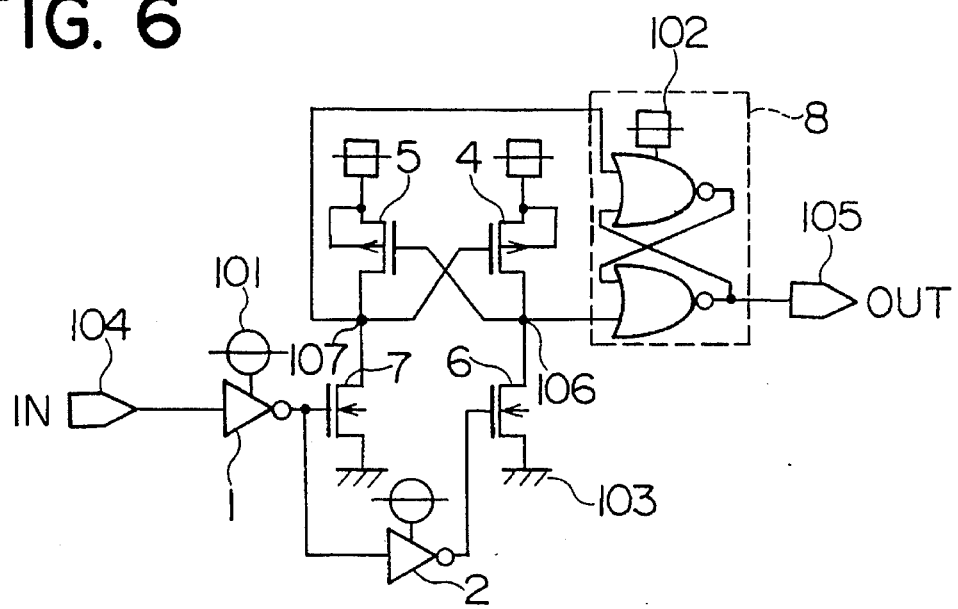
FIG. 6 is a circuit diagram showing the construction of a level converter circuit as a third embodiment.

FIG. 6 shows a level converter circuit as a third embodiment of the present invention. This level converter circuit is different from that of the first embodiment shown in FIG. 1A in that the inverter 3 used in the circuit of the first embodiment is replaced by a flip-flop circuit 8. It is possible to reduce deviation of the duty ratio by shaping the output waveform using the flip-flop circuit 8 as in this embodiment. The output signal 105 of the flip-flop circuit 8 does not change when both the input signals 107 and 106 are at low levels. The output signal 705 is set to high when the signal 107 is high level while the signal 106 is low level. Conversely, when the signal 107 is low level while the signal 106 is high level, the output signal 705 is set to low level. Consequently, the output signal 105 exhibits a solid-line waveform 105*b* in each of the timing charts shown in FIGS. 2 to 5, whereby deviation of the duty ratio is reduced.

Figure 7:
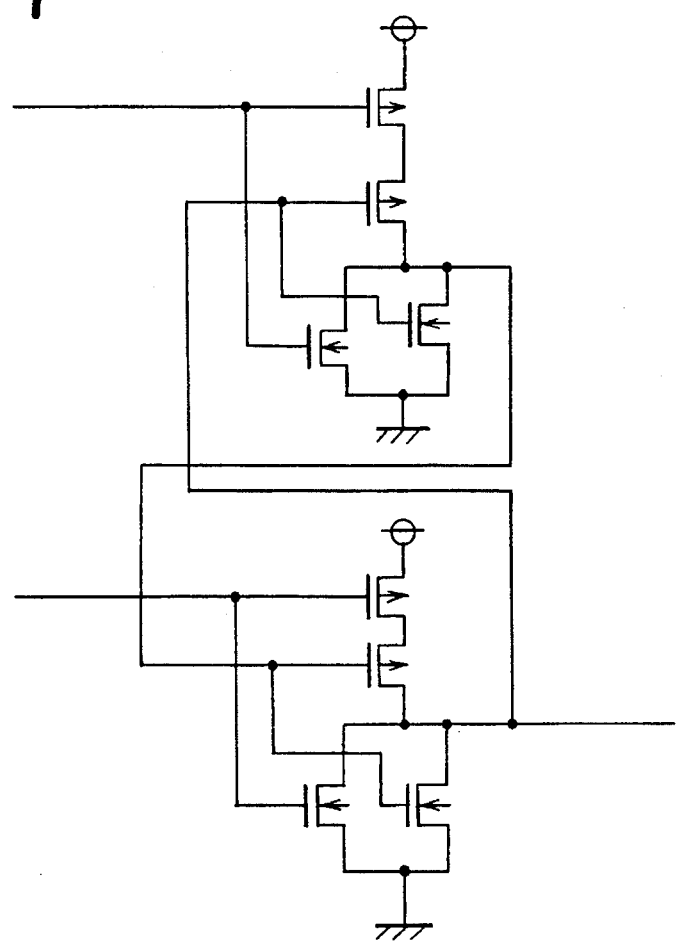
FIG. 7 is a circuit diagram showing the construction of a flip-flop circuit used in the third embodiment.

FIG. 7 illustrates an example of the circuit construction of the flip-flop circuit 8, including eight transistors. In this flip-flop circuit 8 also, the β value of each N-channel transistor is determined to be more than 50 times the β value of each P-channel transistor. The β value of the P-channel transistor is set to a level of, for example, 31 μA/V² or greater. With such conditions, level conversion is possible, for example, from 1 volt to 7 volts and vice versa.

Figure 8:
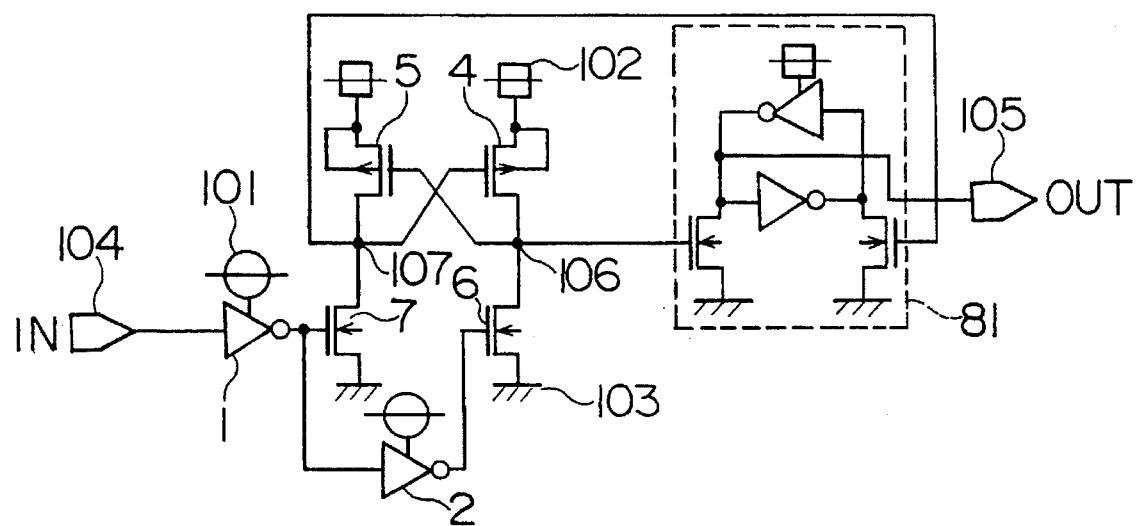
FIG. 8 is a circuit diagram showing the construction of a modification of the third embodiment.
Figure 9:
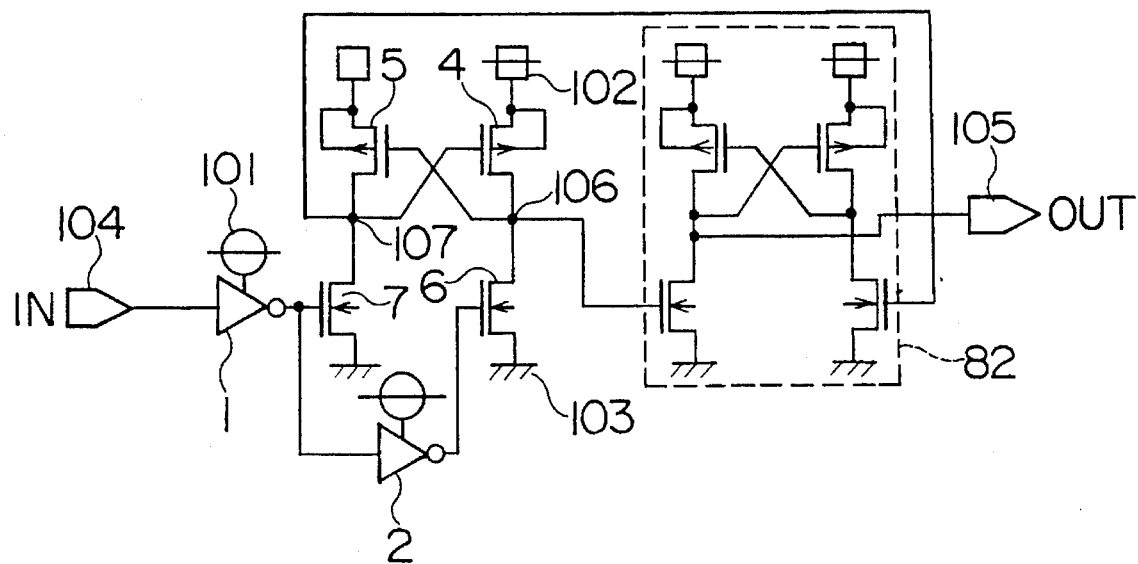
FIG. 9 is a circuit diagram showing the construction of a modification of the third embodiment.

A similar effect is obtained when the flip-flop circuit 8 is replaced by a flip-flop circuit 81 or 82 shown in FIG. 8 or FIG. 9.

Fourth Embodiment

It is possible to reduce, as in the third embodiment shown in FIG. 6, the delay of the output signal 105 with respect to the input signal 104 while suppressing deviation of the duty ratio of the output signal 105, by setting the threshold voltage $V_{TH}$, of the flip-flop circuit 8 to a low level. Consequently, an output signal exhibits the waveform shown by broken-line 105*b* in each of the timing charts shown in FIGS. 2 to 5.

Fifth Embodiment

Figure 10:
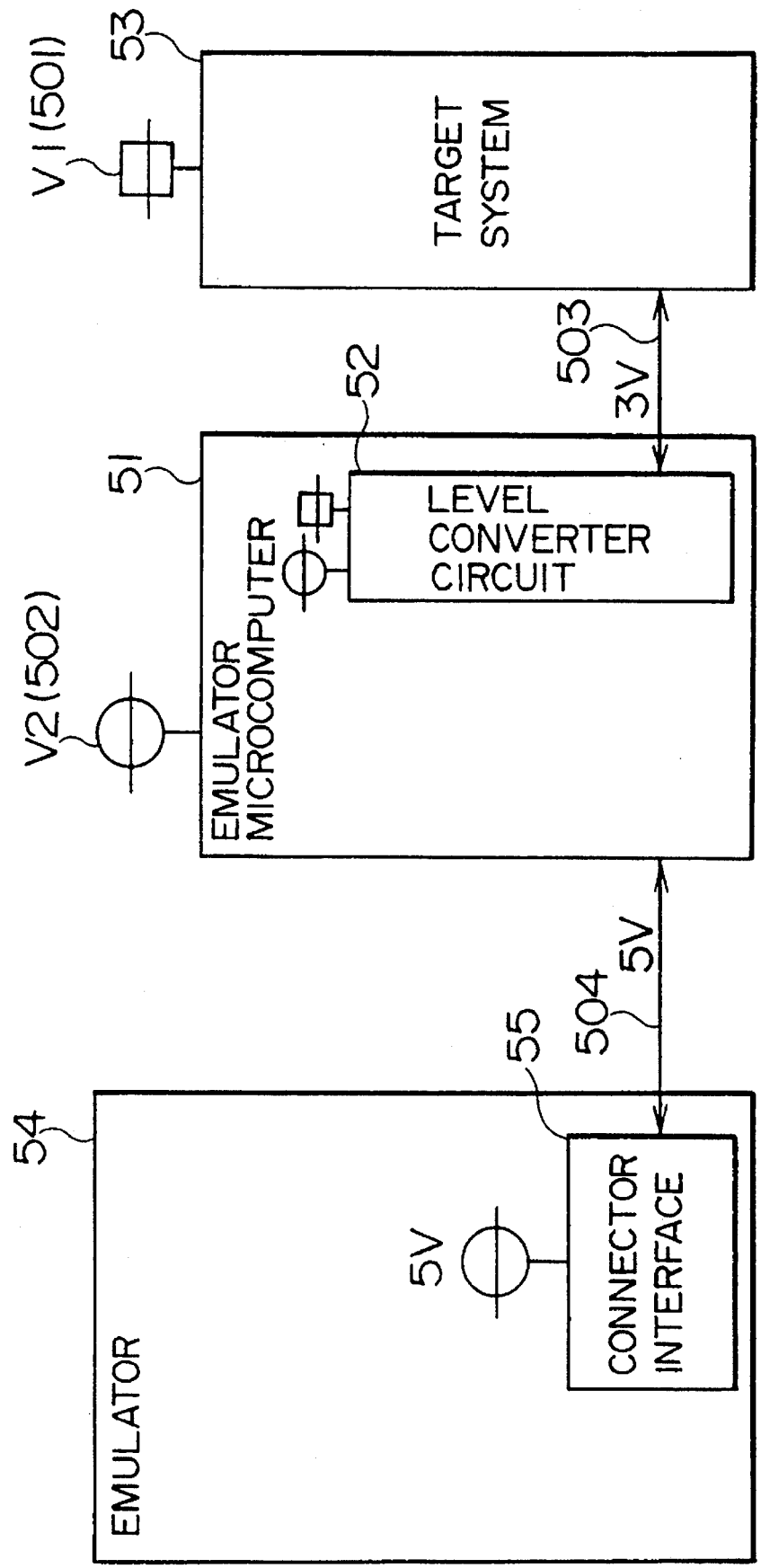
FIG. 10 is a block diagram showing the construction of an emulator system as a fifth embodiment.

FIG. 10 illustrates an emulator system as a fifth embodiment of the present invention. An emulator microcomputer 51 is connected to a connector interface 55 of an emulator 54. A target system 53 is connected to the emulator microcomputer 51. The emulator microcomputer 51 incorporates a level converter circuit 52 of the type used in each of the first to fourth embodiments. The target system 53 is connected to this level converter circuit 52. Numeral 501 designates a 3-volt power supply, 502 denotes a 5-volt power supply, 503 denotes a signal line interconnecting the emulator microcomputer 51 and the target system 53, and 504 denotes a signal line interconnecting the emulator 54 and the emulator microcomputer 51.

Figure 21:
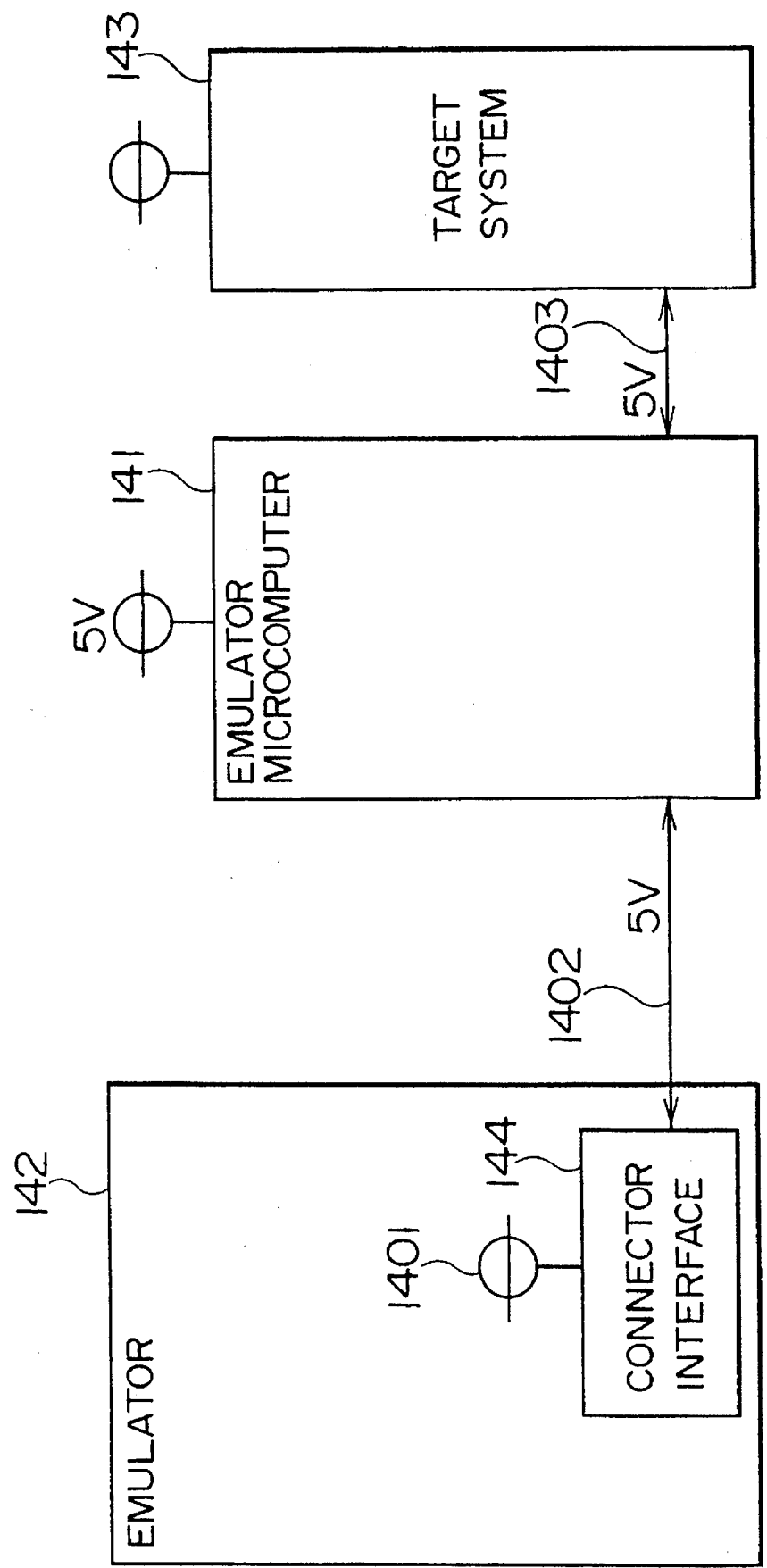
FIG. 21 is a block diagram of a conventional emulator system.

The emulator 54 may be of the same type as the conventional emulator 142 shown in FIG. 21. Since the level converter circuit 52 is incorporated in the emulator microcomputer 51, the emulator 54 operates regardless of the operation voltage of the target system 53. The 5-volt power 502 for the emulator microcomputer 51 is supplied by the emulator 54. The emulator microcomputer 51 operates with this 5-volt power so as to exchange signals at a signal level of 3 volts with the target system 53. Thus, the level converter circuit 52 operates to convert the signal of 5 volts to 3 volts and vice versa. Since the level converter circuit used in the first to fourth embodiments is used as the level converter circuit 52 of this emulate system, the target system 53 can adapt itself to operation down to 1 V–5 MHz.

Sixth Embodiment

Figure 11:
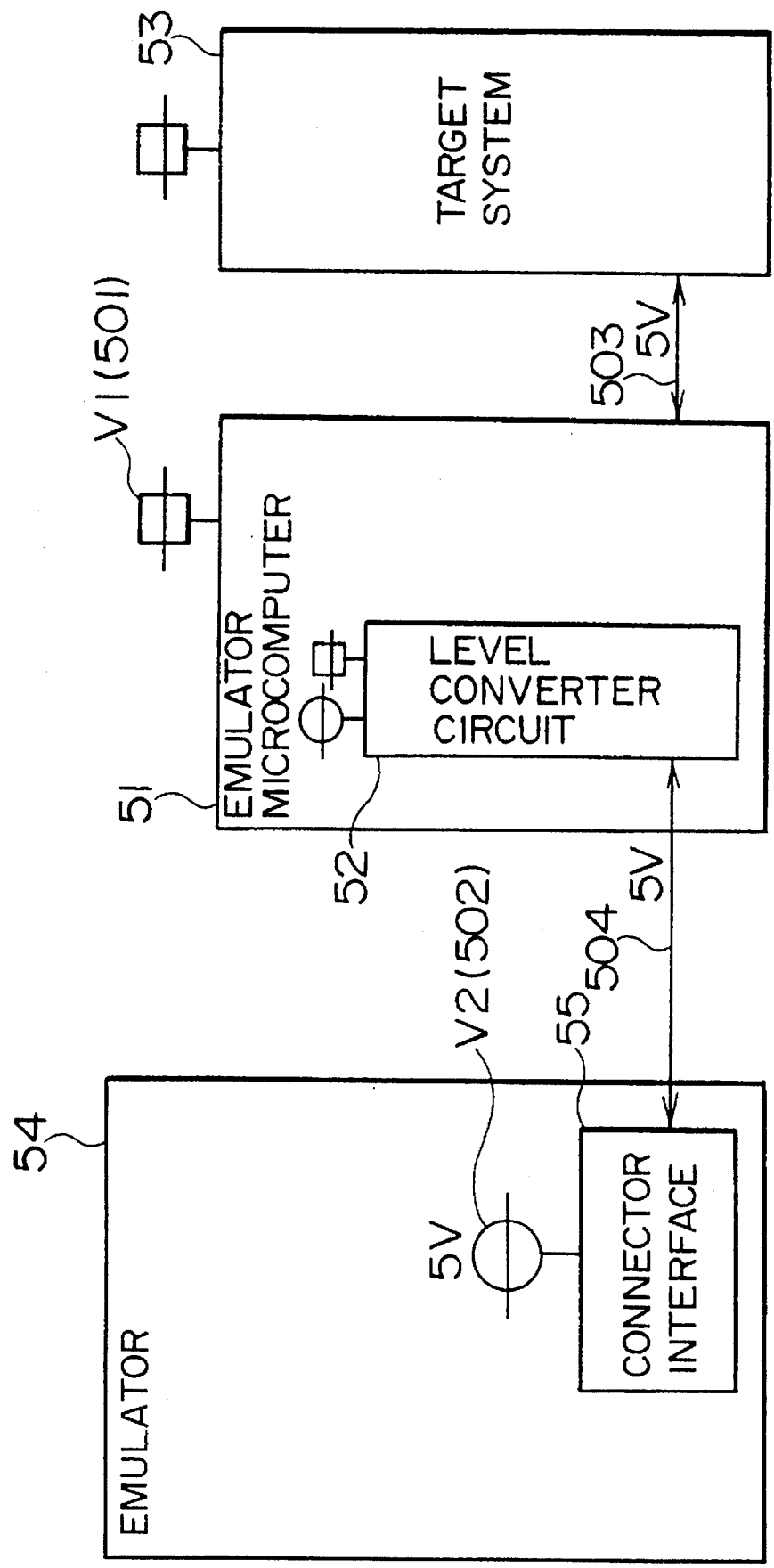
FIG. 11 is a block diagram showing the construction of an emulator system as a sixth embodiment.

FIG. 11 illustrates the construction of an emulate system as a sixth embodiment of the present invention. The system has an emulator microcomputer 51 which incorporates a level converter circuit 52 of the type similar to that used in the first to fourth embodiments. A connector interface 55 of the emulator is connected to the above-mentioned level converter circuit 52. A target system 53 is connected to the emulator microcomputer 51. In this embodiment, the emulator microcomputer 51 operates with power of the same voltage as the target system 53, i.e., 3 volts, and the signal exchange between the emulator microcomputer 51 and the emulator 54 is conducted through a signal line 504 at a signal level of 5 volts. When the emulator microcomputer 51 includes an analog circuit or when the current in the signal line 503 and the operation current of the target system are to be evaluated, it is preferred that the emulator microcomputer 51 be operated with the same voltage as the target system 53. The target system 53 can adapt itself to operation down to 1 V–5 MHz also in this embodiment.

Seventh Embodiment

Figure 12:
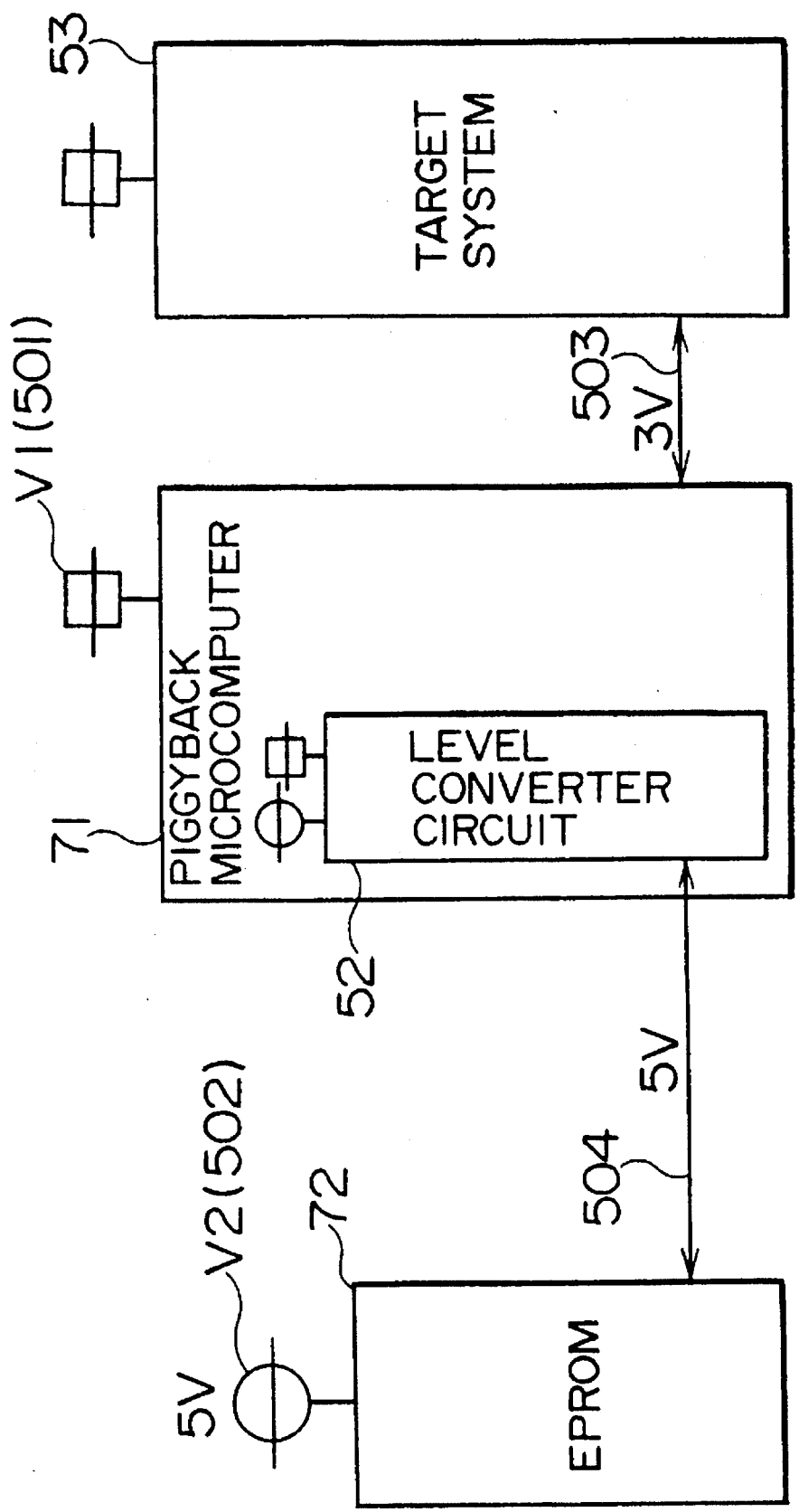
FIG. 12 is a block diagram showing the construction of a piggyback microcomputer as a seventh embodiment.

FIG. 12 illustrates a seventh embodiment in which a piggyback microcomputer 71 incorporates a level converter circuit 52. An EPROM 72 is connected to the level converter circuit 52 in the piggyback microcomputer 71. The EPROM 72 operates with a source voltage of 5 volts, while the target system 53 and the piggyback microcomputer 71 operate with 3-volt power. In this case, the 5-volt power has to be derived from an external source, though the 3-volt power can be supplied from the target system 53. The target system 53 is adaptable to operation down to 1 V–5 MHz also in this case.

Figure 13:
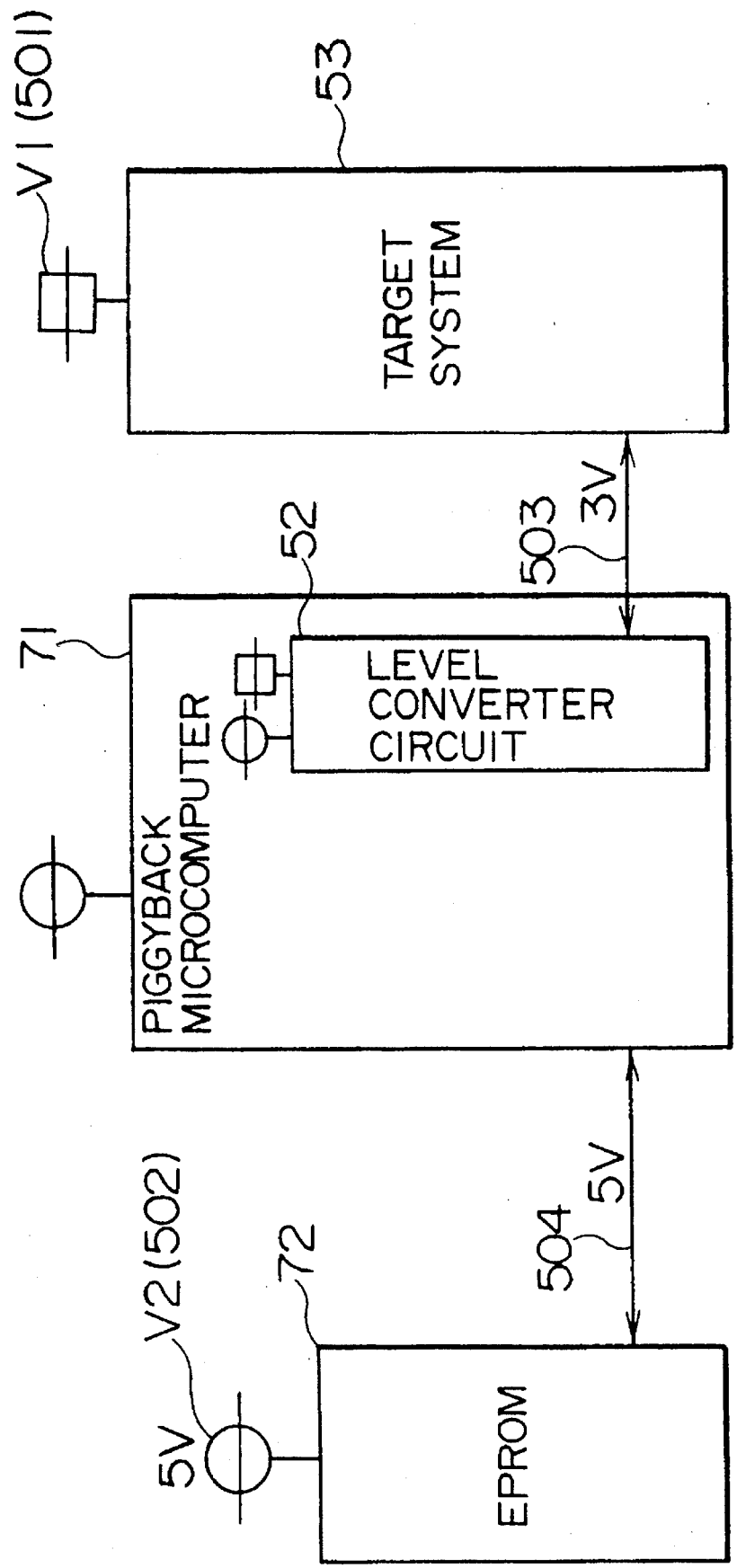
FIG. 13 is a block diagram showing the construction of a modification of the seventh embodiment.

The arrangement also may be such that the piggyback microcomputer 71 is operated with 5-volt power, while the level of the signal 503 exchanged between the piggyback microcomputer 71 and the target system 53 is converted to 3 volts as shown in FIG. 13.

Eighth Embodiment

Figure 14:
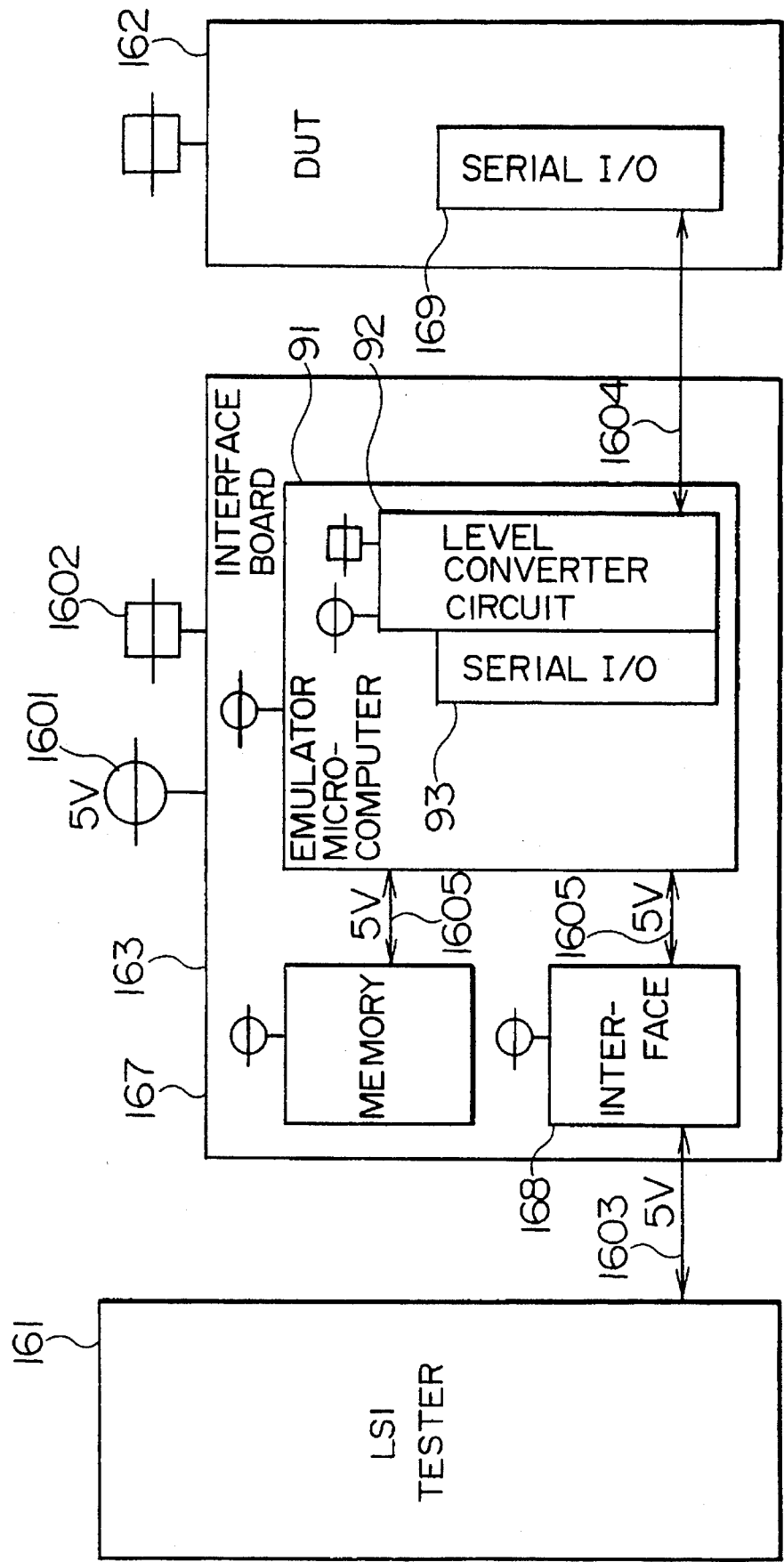
FIG. 14 is a block diagram showing the construction of an LSI test system as a ninth embodiment.

FIG. 14 shows the construction of an LSI testing system which employs an emulator microcomputer incorporating a level converter circuit.

The LSI testing system has an interface board 163 to which are connected an emulator microcomputer 91, a memory 167 storing programs for operating the emulator microcomputer 91 microcomputer 91, and an interface 168. The emulator microcomputer 91 incorporates a level converter circuit 92. A serial I/O 169 of DUT 162 is connected to the level converter circuit 92. An LSI tester 161 is connected to the interface 168 of the interface board 163.

The emulator microcomputer 91, the memory 167 and the interface 168 are operated with 5-volt power, and exchange of signals between the serial I/O 93 of the emulator microcomputer 91 and the serial I/O 169 of DUT 162 is conducted through the level converter circuit 92. Clock and reset signals necessary for operating the DUT 162 may be obtained by level-converting, by means of the level converter circuit 92, the signal input from the LSI tester 161 to the emulator microcomputer 91. With such an arrangement, it is possible to reduce the load on the LSI tester 161.

It is possible to use, as the emulator microcomputer 91, the same microcomputer as that tested as the DUT 162. In such a case, the test is further facilitated because the serial I/O 93 and the serial I/O 169 have the same function. The serial I/O of an IC card microcomputer for instance, has functions which are not provided in ordinary serial I/O, e.g., a re-sending function. Testing of such functions is facilitated when a computer of the same type as that tested is used as the emulator microcomputer 91. In this test system, a piggyback microcomputer can be used in place of the emulator microcomputer, provided that the piggyback microcomputer can execute a program stored in an external memory. The test can be conducted over a wide range of from 1 V-5 MHz to 7 V–50 MHz, when the testing system incorporates the level converter circuit used in the first to fourth embodiments.

Ninth Embodiment

Figure 15:
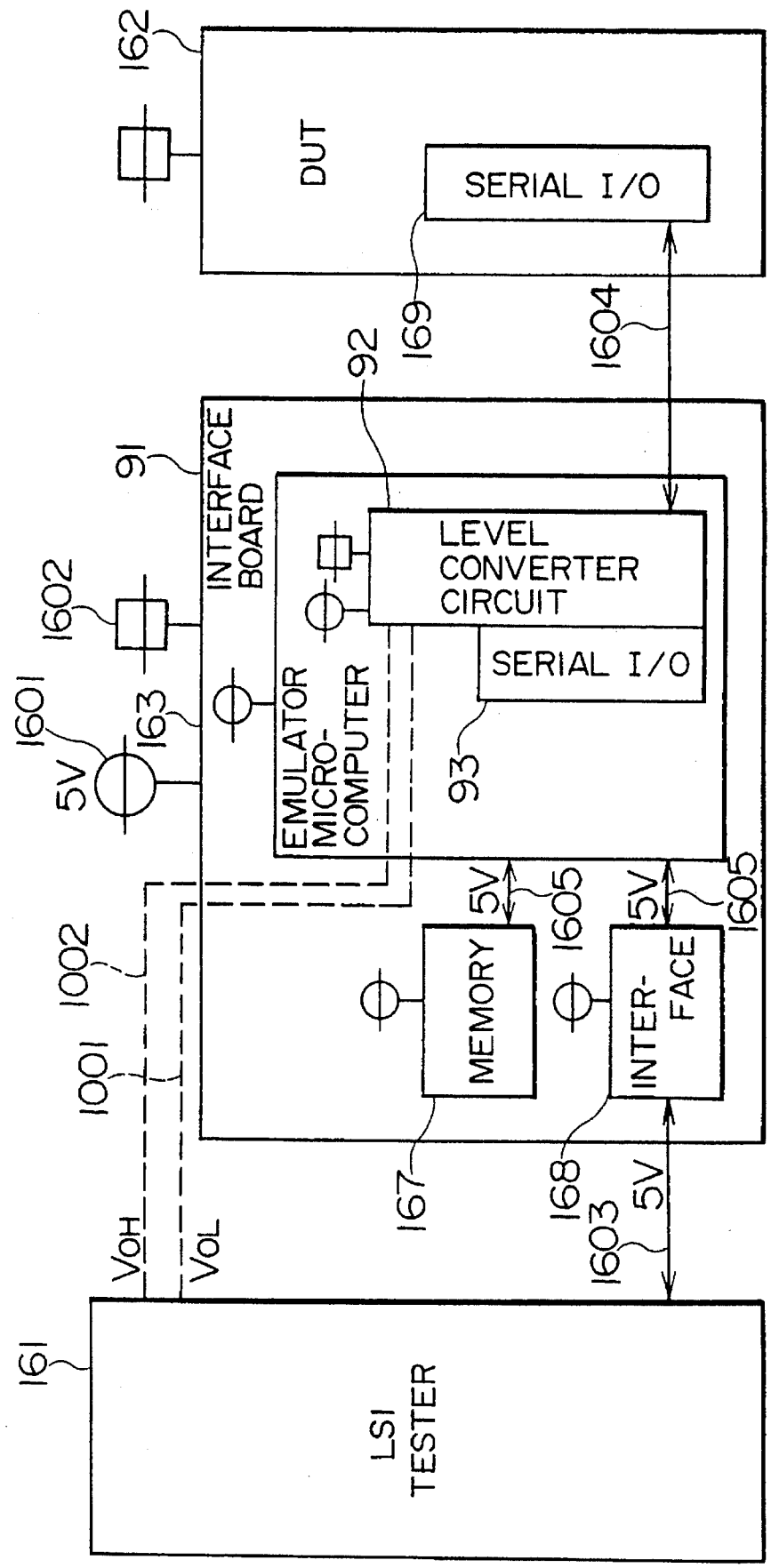
FIG. 15 is a block diagram showing the construction of an LSI test system as a ninth embodiment.

FIG. 15 shows the construction of an LSI testing system as a ninth embodiment of the present invention. The LSI testing system of this embodiment is obtained by modifying the testing system of the eighth embodiment such that the LSI tester 161 is connected to the level converter circuit 92 in the emulator microcomputer 91 through signal lines 1001 and 1002 so as to enable the LSI tester 161 to set the high level $V_{OH}$, and low level $V_{OL}$ of the level-converted output of the level converter circuit 92. Using this level converter circuit 92, the high and low levels $V_{TH}$ and $V_{IL}$ of the input voltage input to the PUT 162 can easily be tested.

Figure 16:
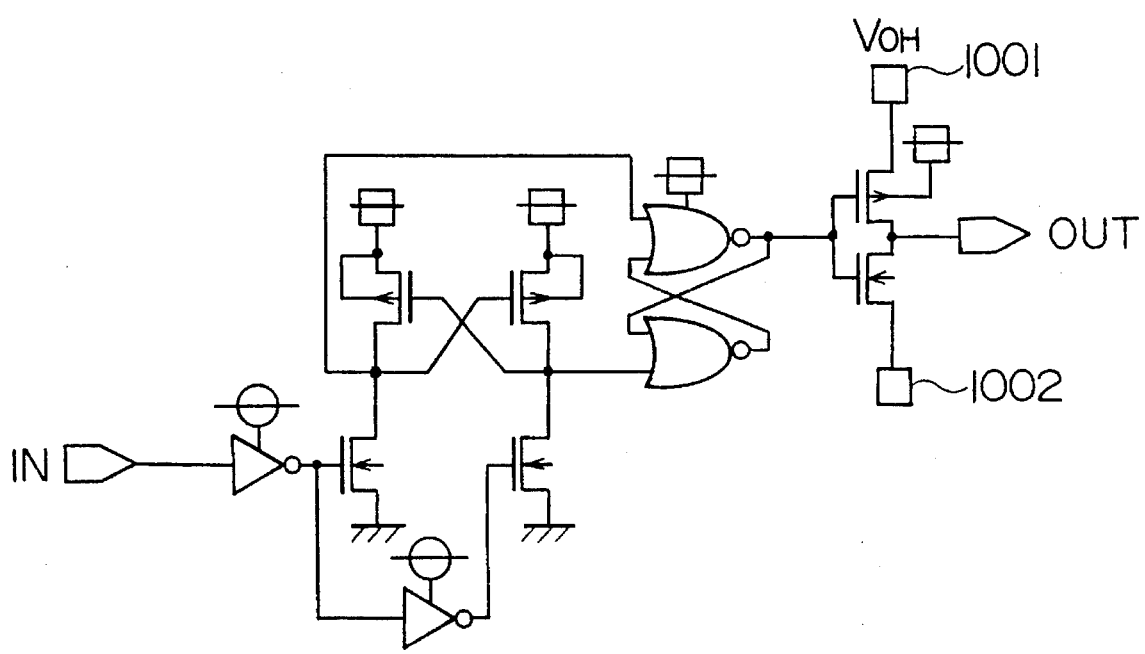
FIG. 16 is a circuit diagram showing the construction of a level converter circuit used in the ninth embodiment.

A level converter circuit, capable of performing the above-described setting of the high and low levels $V_{OH}$ and $V_{OL}$ of the output signal, is shown in FIG. 16 by way of example. The high and low levels $V_{OH}$ and $V_{OL}$ of the output signal are determined by selecting the potentials of the signal lines 1001 and 1002.

Tenth Embodiment

Figure 17:
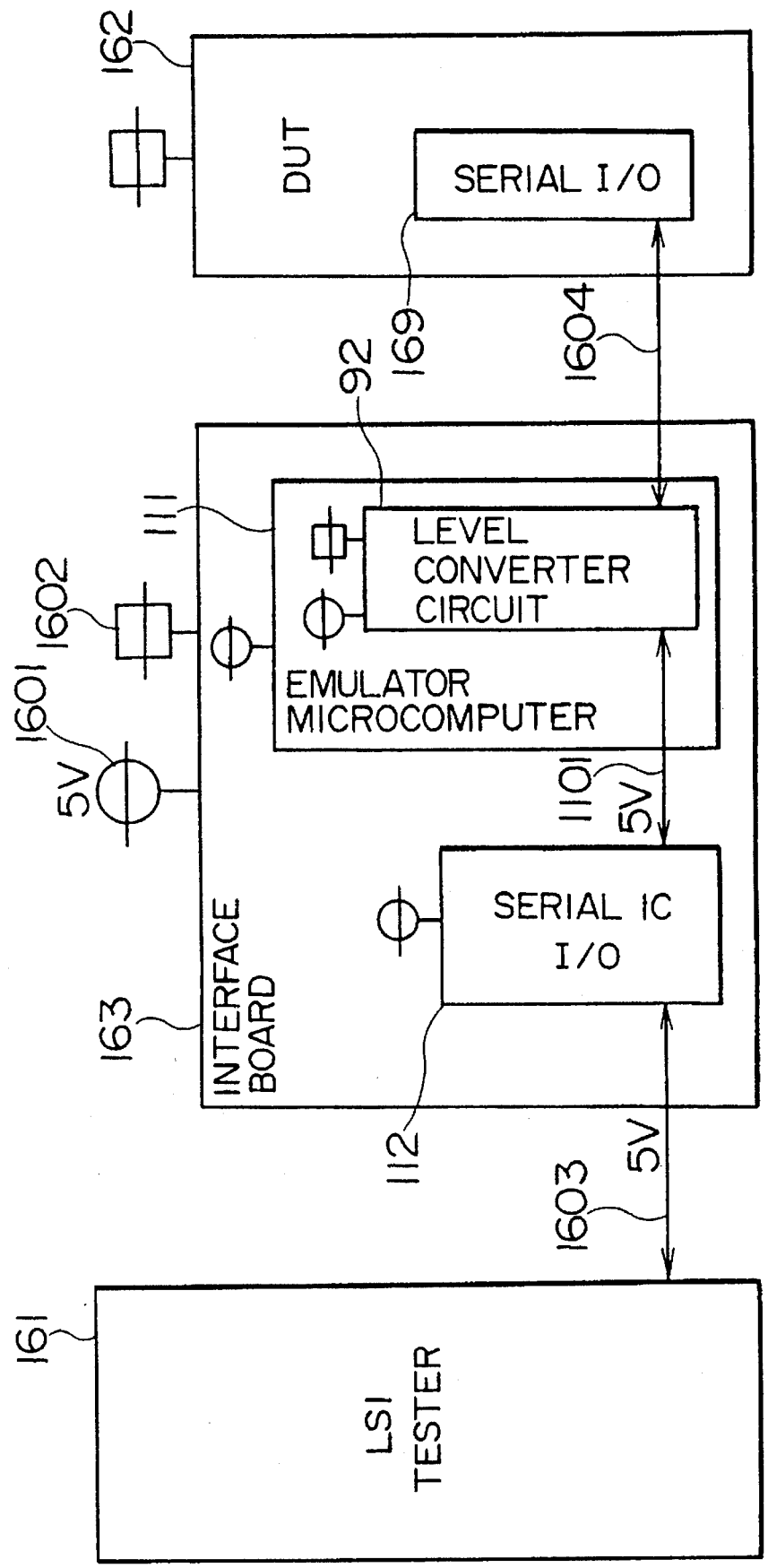
FIG. 17 is a block diagram showing the construction of an LSI test system as a tenth embodiment.
Figure 18:
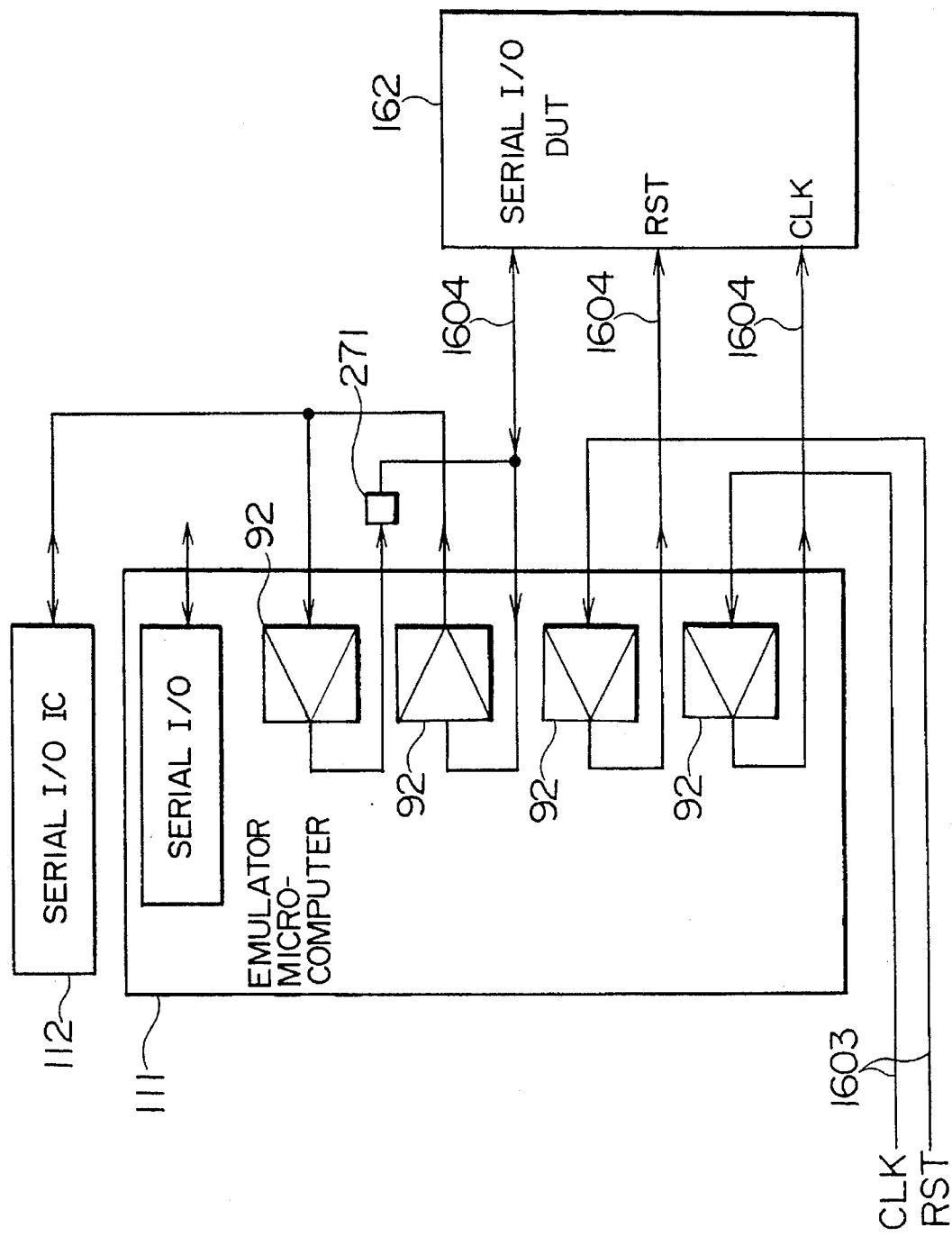
FIG. 18 is a block diagram showing the construction of an emulator microcomputer used in the tenth embodiment.
Figure 19:
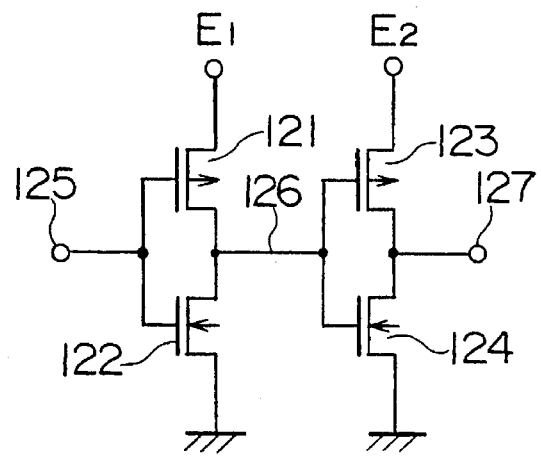
FIG. 19 is a circuit diagram showing the construction of a complementary MOS integrated circuit.
Figure 20:
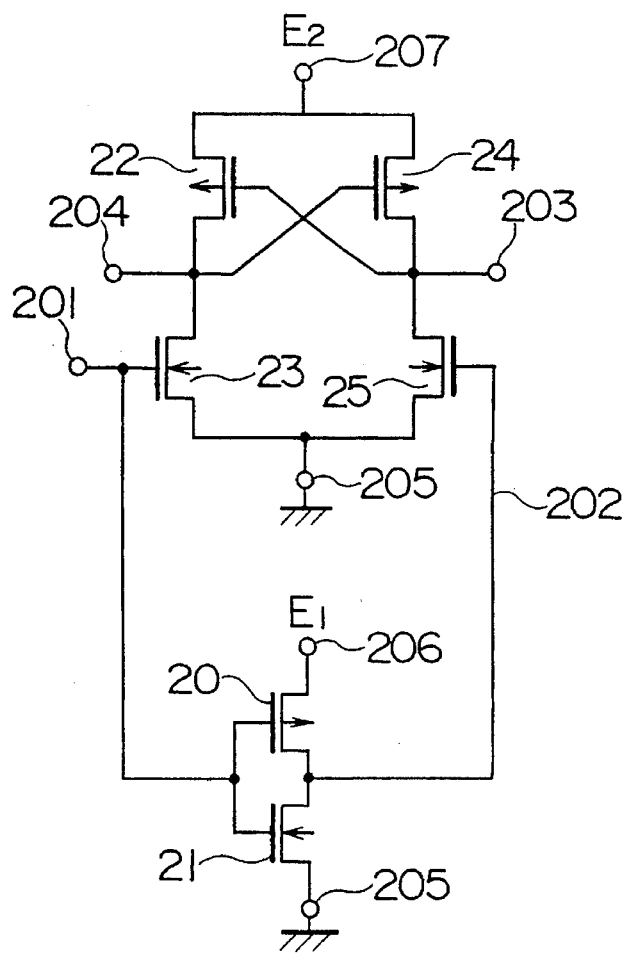
FIG. 20 is a circuit diagram showing the construction of a known complementary level converter circuit.

FIG. 17 is a block diagram of an LSI testing system as a tenth embodiment of the present invention. An emulator microcomputer 111 and an IC 112 constituting the serial I/O are mounted on the interface board 163. An LSI tester 161 is connected to the serial I/O IC 112 which in turn is connected to a level converter circuit 92 in the microcomputer 111. The level converter circuit 92 is connected to a serial I/O 169 of the DUT 162. The emulator microcomputer 111 uses only the level converter circuit 92. This arrangement effectively reduces the load on the LSI tester 161. The emulator microcomputer 111 can be implemented by using the input and output terminals of the level converter circuit 92 as the external connection terminals of the microcomputer 111, as shown in FIG. 18. When DUT 162 is an IC card microcomputer, since only one I/O terminal is available, it is necessary to connect a change-over circuit 271 between the emulator microcomputer 111 and the DUT 162 for the purpose of change-over between input and output, as shown in FIG. 18.

The emulator system which makes use of the emulator microcomputer of the fifth or the sixth embodiment can perform a function which could never be realized by conventional systems.

Figure 22:
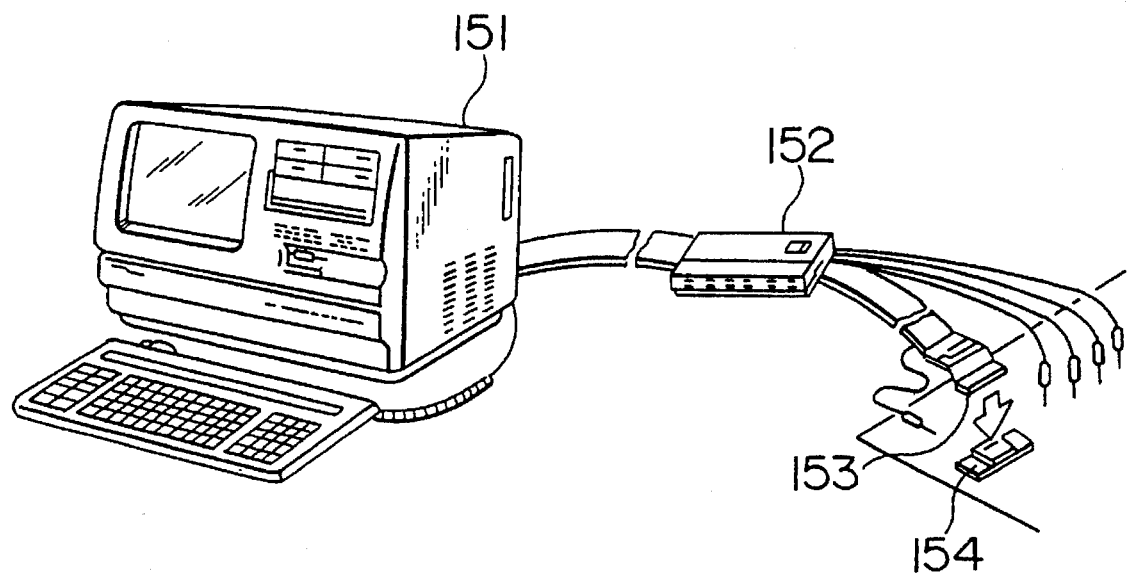
FIG. 22 is an illustration of a conventional emulator system.
Figure 23:
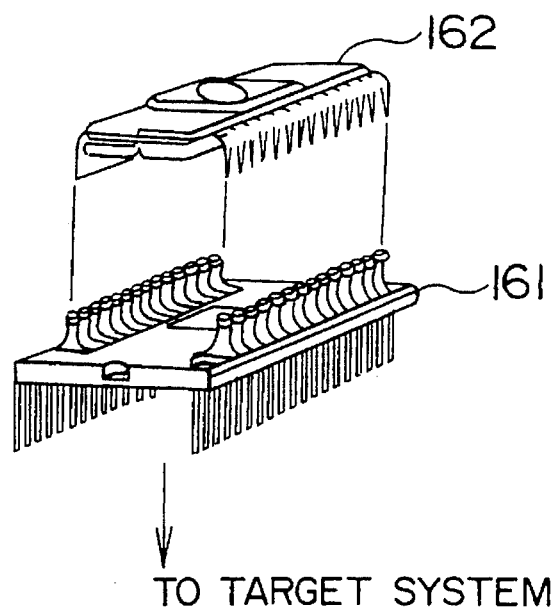
FIG. 23 is an illustration of a conventional piggyback microcomputer.
Figure 24:
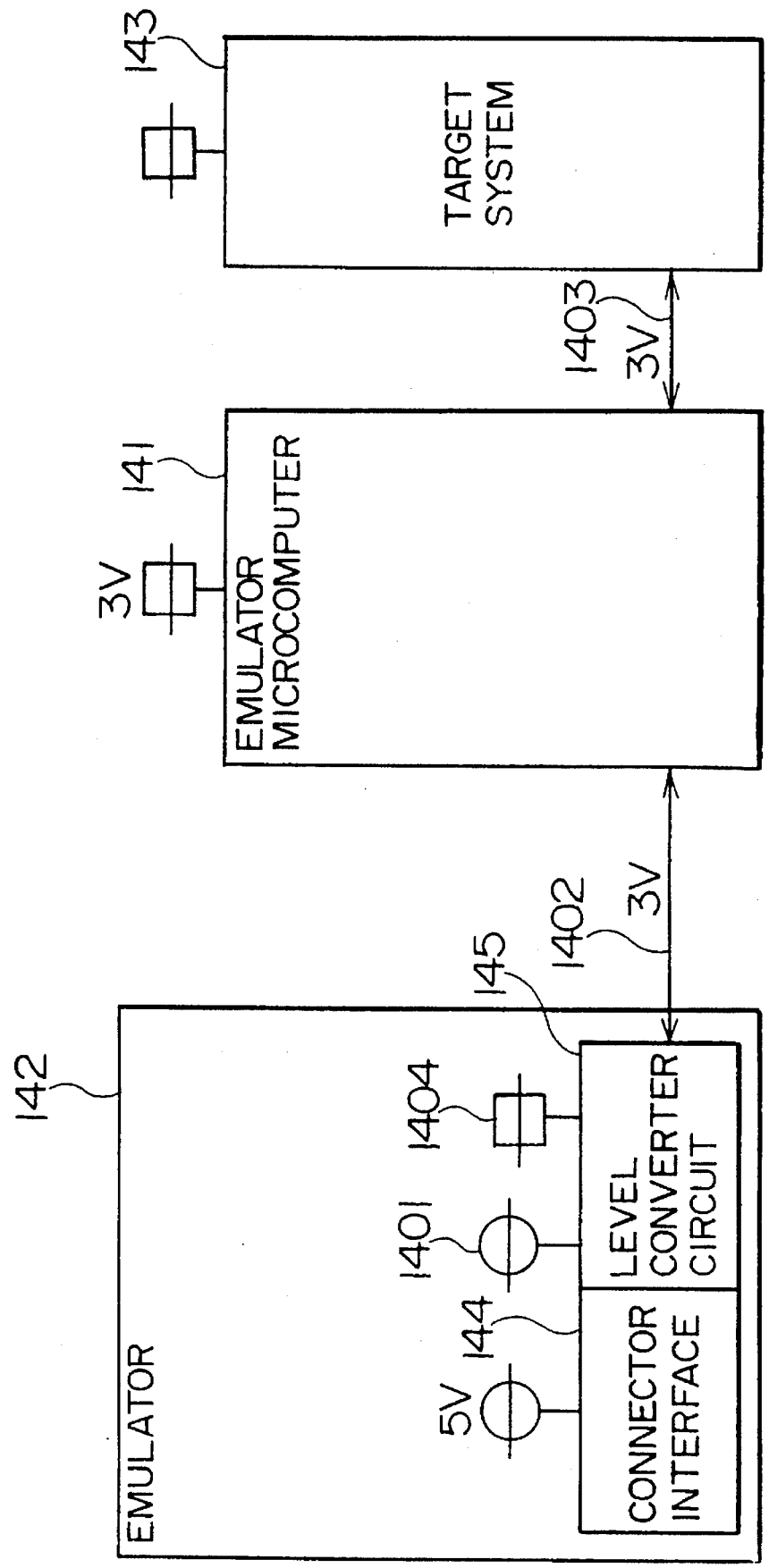
FIG. 24 is a block diagram showing the construction of a known emulator system.
Figure 25:
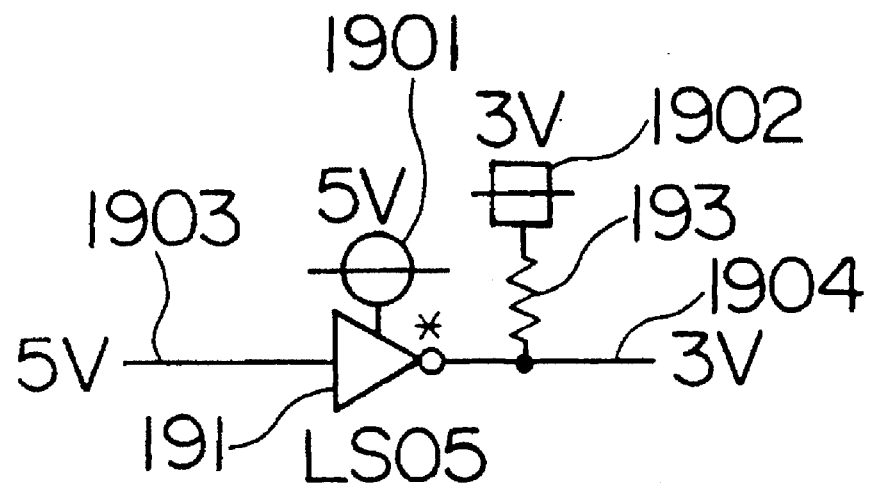
FIG. 25 is a circuit diagram showing the construction of a known level converter circuit.
Figure 26:
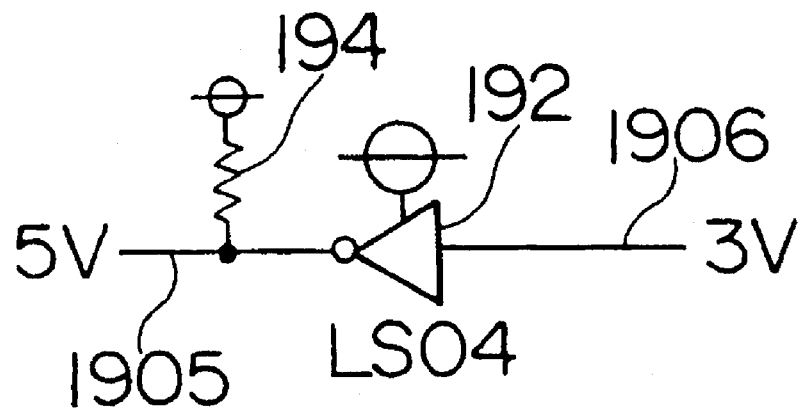
FIG. 26 is a circuit diagram showing the construction of a conventional level converter circuit.
Figure 27:
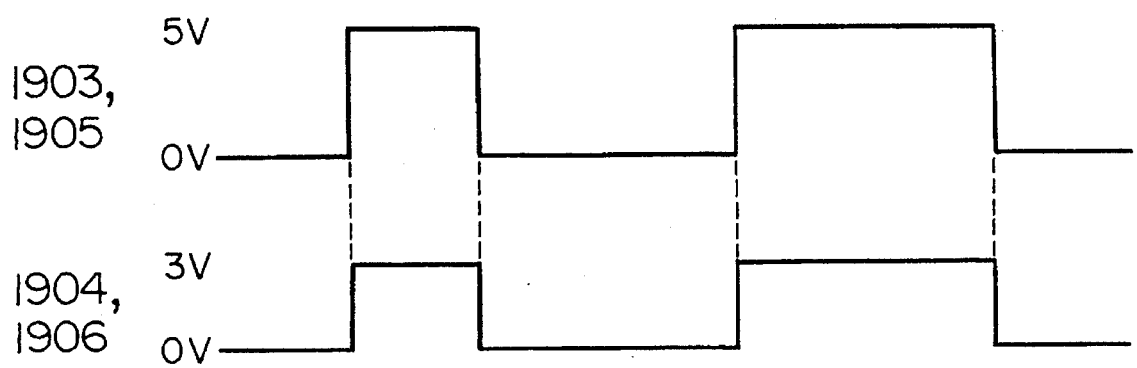
FIG. 27 is a timing chart illustrative of the operation of the converter circuit shown in FIG. 25 or FIG. 26.
Figure 28:
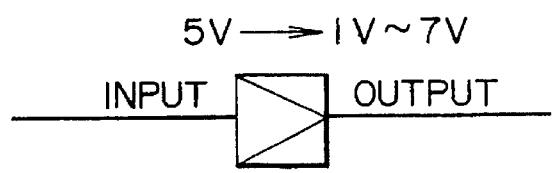
FIG. 28 is an illustration of the a manner in which an input voltage is level-converted into an output voltage through a level converter circuit.
Figure 29:
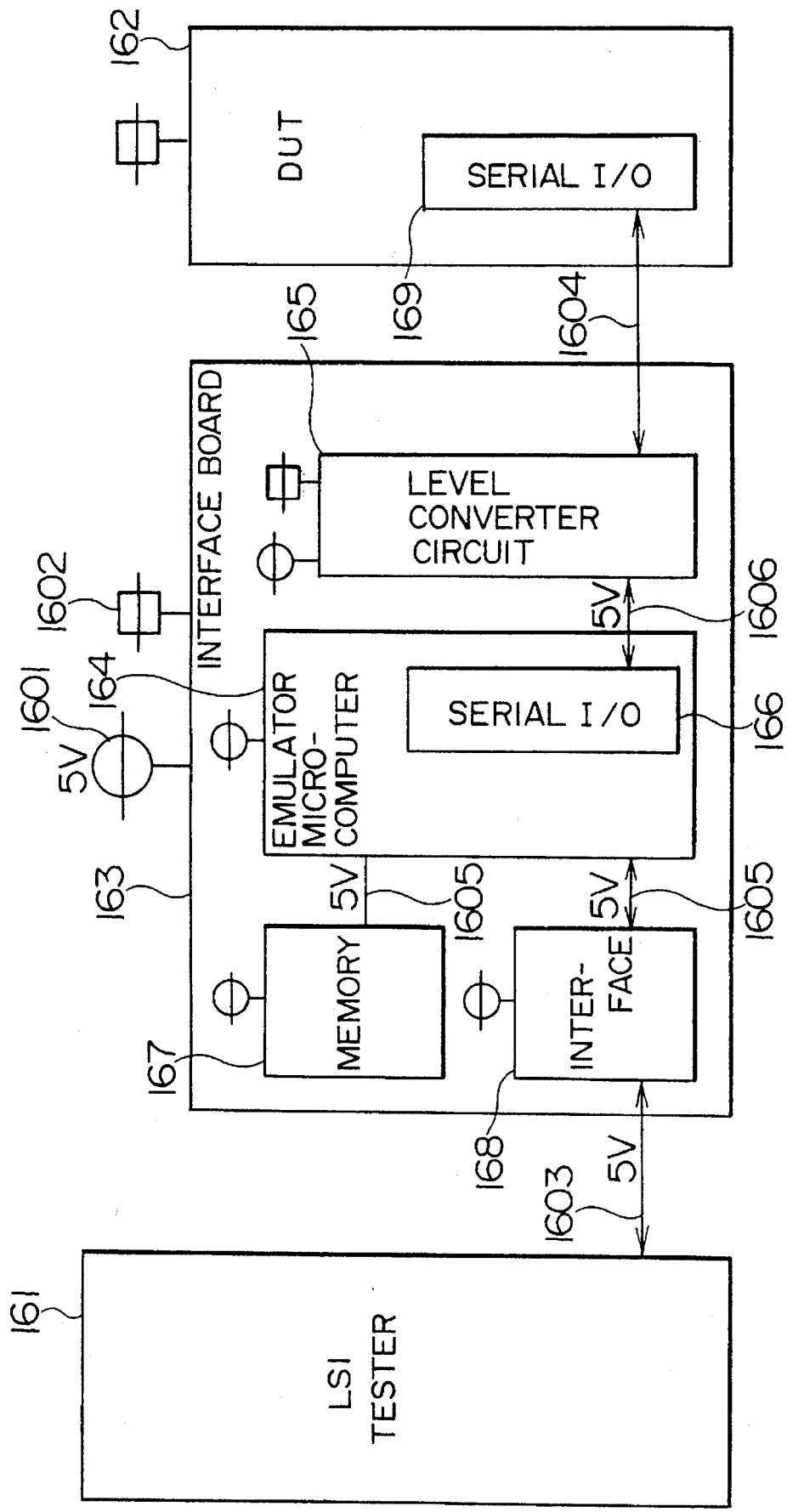
FIG. 29 is a block diagram of a known LSI test system.

Referring now to FIG. 22 showing a conventional emulator system, it is impossible to mount the emulator microcomputer 153 directly on the IC socket of the target system 154, when the operation voltage of the target system 154 is different from that of the main part 151. Thus, the conventional system required modification of the main part 151 or the pod 152. For instance, a conventional arrangement is such that the emulator microcomputer 153 is accommodated in the main part 151 or the pod 152 or otherwise mounted on a substrate, and a level converter circuit is added to the emulator microcomputer 153 and connected to the target system 154. This makes it impossible to realize a design with the emulator microcomputer mounted in the vicinity of the target system, thus hampering the most significant advantage of the emulator system of the type described.

It is to be noted that, however, the emulate system can be used regardless of the operation voltage of the target system, provided that the level converter circuit is incorporated in the emulator microcomputer as in the present invention. In particular, emulator system affords operation of the target system over a wide range of from 1 V–5 MHz to 7 V–50 Mhz, when the emulator microcomputer incorporates the level converter circuit which is used in the first to fourth embodiments, thus enabling not only the emulation of the target system but also evaluation under varying voltage and frequency.

What is claimed is:

1. A level converter comprising:

first and second P-channel transistors having respective gates, sources, drains, and identical first $\beta$ values, the sources being commonly connected to a first potential V1 and the drains of said first and second P-channel transistors being connected to the gates of said second and first P-channel transistors, respectively;

first and second N-channel transistors having respective gates, sources, drains, and identical second $\beta$ values, the drains of said first and second N-channel transistors being respectively connected to the drains of said first and second P-channel transistors, and the sources of said first and second N-channel transistors being grounded wherein the second $\beta$ value is more than 50 times the first $\beta$ value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

2. An emulator microcomputer for connection between an emulator and a target system comprising a level converter circuit for level conversion of a signal transmitted between said emulator microcomputer and said target system, said level converter circuit including:

first and second P-channel transistors having respective gates, sources, drains, and identical first $\beta$ values, the sources being commonly connected to a first potential V1 and the drains of said first and second P-channel transistors being connected to the gates of said second and first P-channel transistors, respectively;

first and second N-channel transistors having respective gates, sources, drains, and identical second $\beta$ values, the drains of said first and second N-channel transistors being respectively connected to the drains of said first and second P-channel transistors, and the sources of said first and second N-channel transistors being grounded wherein the second $\beta$ value is more than 50 times the first $\beta$ value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

3. An emulator microcomputer for connection between an emulator and a target system comprising a level converter circuit for level conversion of a signal transmitted between said emulator microcomputer and said emulator, said level converter circuit including:

first and second P-channel transistors having respective gates, sources, drains, and identical first $\beta$ values, the sources being commonly connected to a first potential V1 and the drains of said first and second P-channel transistors being connected to the gates of said second and first P-channel transistors, respectively;

first and second N-channel transistors having respective gates, sources, drains, and identical second $\beta$ values, the drains of said first and second N-channel transistors being respectively connected to the drains of said first and second P-channel transistors, and the sources of said first and second N-channel transistors being grounded wherein the second $\beta$ value is more than 50 times the first $\beta$ value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

4. A piggyback microcomputer for connection between an EPROM and a target system comprising a level converter circuit for level conversion of a signal transmitted between said EPROM and said piggyback microcomputer, said level converter circuit including:

first and second P-channel transistors having respective gates, sources, drains, and identical first β values, the sources being commonly connected to a first potential V1 and the drains of said first and second P-channel transistors being connected to the gates of said second and first P-channel transistors, respectively;

first and second N-channel transistors having respective gates, sources, drains, and identical second β values, the drains of said first and second N-channel transistors being respectively connected to the drains of said first and second P-channel transistors, and the sources of said first and second N-channel transistors being grounded wherein the second β value is more than 50 times the first β value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

5. A piggyback microcomputer for connection between an EPROM and a target system comprising a level converter circuit for level conversion of a signal transmitted between said piggyback microcomputer and said target system, said level converter circuit including:

first and second P-channel transistors having respective gates, sources, drains, and identical first β values, the sources being commonly connected to a first potential V1 and the drains of said first and second P-channel transistors being connected to the gates of said second and first P-channel transistors, respectively;

first and second N-channel transistors having respective gates, sources, drains, and identical second β values, the drains of said first and second N-channel transistors being respectively connected to the drains of said first and second P-channel transistors, and the sources of said first and second N-channel transistors being grounded wherein the second β value is more than 50 times the first β value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

6. An LSI testing system for testing mass-produced microcomputers comprising:

an LSI tester for performing the test; and a level converter circuit for connection between said LSI tester and a mass-produced microcomputer for level conversion of a signal transmitted between the mass-produced microcomputer and said level converter circuit wherein said level converter circuit includes:

first and second P-channel transistors having respective gates, sources, drains, and identical first β values, the sources being commonly connected to a first potential V1 and the drains of said first and second P-channel transistors being connected to the gates of said second and first P-channel transistors, respectively;

first and second N-channel transistors having respective gates, sources, drains, and identical second β values, the drains of said first and second N-channel transistors being respectively connected to the drains of said first and second P-channel transistors, and the sources of said first and second N-channel transistors being grounded wherein the second β value is more than 50 times the first β value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

7. An emulator system comprising:

an emulator; and an emulator microcomputer for connection between said emulator and a target system wherein said emulator microcomputer comprises a level converter circuit for level conversion of a signal transmitted between said emulator microcomputer and said target system, said level converter circuit including:

first and second P-channel transistors having respective gates, sources, drains, and identical first β values, the sources being commonly connected to a first potential V1 and the drains of said first and second P-channel transistors being connected to the gates of said second and first P-channel transistors, respectively;

first and second N-channel transistors having respective gates, sources, drains, and identical second $\beta$ values, the drains of said first and second N-channel transistors being respectively connected to the drains of said first and second P-channel transistors, and the sources of said first and second N-channel transistors being grounded wherein the second $\beta$ value is more than 50 times the first $\beta$ value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

8. An emulator system comprising:

an emulator; and an emulator microcomputer for connection between said emulator and a target system wherein said emulator microcomputer comprises a level converter circuit for level conversion of a signal transmitted between said emulator microcomputer and said emulator, said level converter circuit including:

first and second P-channel transistors having respective gates, sources, drains ,and identical first $\beta$ values, the sources being commonly connected to a first potential V1 and the drains of said first and second P-channel transistors being connected to the gates of said second and first P-channel transistors, respectively;

first and second N-channel transistors having respective gates, sources, drains, and identical second $\beta$ values, the drains of said first and second N=channel transistors being respectively connected to the drains of said first and second P-channel transistors, and the sources of said first and second N-channel transistors being grounded wherein the second $\beta$ value is more than 50 times the first $\beta$ value;

a first inverter for inverting a level-conversion input signal and supplying the inverted level-conversion input signal as an output signal of said first inverter to the gate of said second N-channel transistor, said first inverter being operated by a power supply at a second potential V2 different from the first potential V1;

a second inverter for inverting the output signal of said first inverter and supplying that inverted signal to the gate of said first N-channel transistor, said second inverter being operated by a power supply at the second potential V2; and a flip-flop circuit for receiving a first signal produced at the drain of said first P-channel transistor and the drain of said first N-channel transistor, receiving a second signal produced at the drain of said second P-channel transistor and the drain of said second N-channel transistor, producing an output signal of said level converter circuit, and changing state only when either of the first and second signals changes state from a low level.

* * * * *